United States Patent
Liu et al.

(10) Patent No.: US 10,707,896 B2
(45) Date of Patent: Jul. 7, 2020

(54) FORWARD AND BACKWARD SMOOTH DECODING METHOD, DEVICE, AND SYSTEM

(71) Applicant: Shenzhen Super Data Link Technology Ltd., Guangdong (CN)

(72) Inventors: Ruopeng Liu, Guangdong (CN); Chunlin Ji, Guangdong (CN); Xingan Xu, Guangdong (CN); Shasha Zhang, Guangdong (CN)

(73) Assignee: SHENZHEN SHEN ZHEN KUANG-CHI HEZHONG TECHNOLOGY LTD, Shenshen (CN)

( * ) Notice: Subject to any disclaimer, the term of this patent is extended or adjusted under 35 U.S.C. 154(b) by 0 days.

(21) Appl. No.: 16/379,622

(22) Filed: Apr. 9, 2019

(65) Prior Publication Data
US 2019/0238155 A1 Aug. 1, 2019

Related U.S. Application Data

(63) Continuation of application No. PCT/CN2017/103311, filed on Sep. 26, 2017.

(30) Foreign Application Priority Data

Oct. 10, 2016 (CN) .......................... 2016 1 0886096
Oct. 10, 2016 (CN) .......................... 2016 1 0886190

(51) Int. Cl.
*H03M 1/00* (2006.01)
*H03M 7/32* (2006.01)
(Continued)

(52) U.S. Cl.
CPC .......... *H03M 7/3037* (2013.01); *G06F 17/18* (2013.01); *H03M 7/304* (2013.01);
(Continued)

(58) Field of Classification Search
CPC .... G11B 2020/1859; G11B 2020/1222; G06F 11/1004; H03M 5/02
(Continued)

(56) References Cited

U.S. PATENT DOCUMENTS

2003/0093753 A1* 5/2003 Okamura .......... H03M 13/3905
714/792
2016/0084869 A1 3/2016 Yuen et al.

FOREIGN PATENT DOCUMENTS

CN 101340266 A 1/2009
CN 101425870 A 5/2009
(Continued)

OTHER PUBLICATIONS

Search Report dated Dec. 28, 2017 for PCT/CN2017/103311 filed Sep. 26, 2017, 2 pages., Dec. 28, 2017, 2 pages.

*Primary Examiner* — Joseph J Lauture
(74) *Attorney, Agent, or Firm* — Cantor Colburn LLP

(57) ABSTRACT

The present application discloses a forward and backward smooth decoding method and device suitable for an OvXDM system, and a system. Importance weights of particles in a particle set corresponding to a symbol are calculated by using a forward process and a backward process, and screening is performed with reference to forward importance weights of particles and backward importance weights of particles, to output a final decoding sequence.

20 Claims, 12 Drawing Sheets

(51) Int. Cl.
*H03M 7/30* (2006.01)
*G06F 17/18* (2006.01)
*H04L 1/00* (2006.01)
G11B 20/18 (2006.01)
G06F 11/10 (2006.01)
G11B 20/12 (2006.01)

(52) U.S. Cl.
CPC ....... *H03M 7/3062* (2013.01); *H03M 7/6005* (2013.01); *H04L 1/00* (2013.01); *G06F 11/1004* (2013.01); *G11B 2020/1222* (2013.01); *G11B 2020/1859* (2013.01)

(58) Field of Classification Search
USPC .......... 714/792, 752, 758; 708/530; 375/340
See application file for complete search history.

(56) References Cited

FOREIGN PATENT DOCUMENTS

| | | |
|---|---|---|
| CN | 104899921 A | 9/2015 |
| WO | 2014052252 A2 | 4/2014 |

* cited by examiner $$a_0x_0 \quad a_1x_0 \quad a_2x_0 \quad \cdots \quad a_{k-1}x_0$$

$$a_0x_1 \quad a_1x_1 \quad a_2x_1 \quad \cdots \quad a_{k-1}x_1$$

$$a_0x_2 \quad a_1x_2 \quad a_2x_2 \quad \cdots \quad a_{k-1}x_2$$

$$\cdots$$

$$a_0x_{k-1} \quad a_1x_{k-1} \quad a_2x_{k-1} \quad \cdots \quad a_{k-1}x_{k-1}$$

FORWARD AND BACKWARD SMOOTH DECODING METHOD, DEVICE, AND SYSTEM

CROSS-REFERENCE TO RELATED APPLICATIONS

This application is a continuation application of PCT/CN2017/103311, filed Sep. 26, 2017, published as WO 2018/068630, which claims the priority of Chinese Application No. 201610886190.0, filed Oct. 10, 2016 and Chinese Application No. 201610886096.5, filed Oct. 10, 2016. The contents of the above-identified applications are incorporated herein by reference in their entireties.

TECHNICAL FIELD

The present invention relates to the decoding field, and in particular, to a forward and backward smooth decoding method, device, and system.

BACKGROUND

In an overlapped multiplexing system, namely, an OvXDM system, during conventional decoding, a node in a Trellis diagram needs to be continuously accessed. In addition, two memories are disposed for each node. One memory is configured to store a relatively best path for reaching the node, and the other memory is configured to store a measurement corresponding to the relatively best path for reaching the node.

Using an OvTDM system as an example, each node in a trellis diagram needs to be extended in a decoding process. Therefore, a quantity of nodes determines decoding complexity. For a system in which a total number of times of overlapping is K and whose modulation dimensionality is M (M is an integer and is greater than or equal to 2), a quantity of nodes that are in a stable state in a trellis diagram corresponding to the system is $M^{K-1}$, and therefore decoding complexity increases exponentially with the total number K of times of overlapping. However, in the OvTDM system, spectral efficiency of the system is 2K/symbol, and therefore the spectral efficiency is higher if the total number K of times of overlapping is larger. Therefore, on one hand, because of a requirement for improving the spectral efficiency, it is better if the total number K of times of overlapping is larger; on the other hand, because of a requirement for reducing the decoding complexity, it is better if the total number K of times of overlapping is smaller. Particularly, when the total number K of times of overlapping increases to a specific value, for example, K is greater than 8, the decoding complexity increases sharply. An existing decoding method cannot meet a real-time decoding requirement, and a requirement for the spectral efficiency and a requirement for the decoding complexity and decoding efficiency are contradictory.

SUMMARY

According to a first aspect of the present application, the present application provides a forward and backward decoding method which comprises the following steps:

a forward step: starting from a first symbol to a last symbol in an estimation sequence, sequentially calculating importance weights of particles in a particle set corresponding to each symbol, to obtain importance weights of particles in a forward process;

a backward step: starting from the last symbol to the first symbol in the estimation sequence, sequentially calculating importance weights of particles in a particle set corresponding to each symbol with reference to the importance weights of particles obtained in the forward step, to obtain importance weights of particles in a backward process; and an output step: obtaining an estimated value corresponding to each symbol, and outputting a final decoding sequence.

According to a second aspect of the present application, the present application provides a forward and backward decoding device which comprises:

a forward unit, configured to: starting from a first symbol to a last symbol in an estimation sequence, sequentially calculate importance weights of particles in a particle set corresponding to each symbol, to obtain importance weights of particles in a forward smoothing process;

a backward unit, configured to: starting from the last symbol to the first symbol in the estimation sequence, sequentially calculate importance weights of particles in a particle set corresponding to each symbol with reference to the importance weights of particles obtained by the forward unit, to obtain importance weights of particles in a backward smoothing process; and an output unit, configured to output a final decoding sequence.

According to a third aspect of the present application, the present application provides an OvXDM system, including the aforementioned forward and backward smooth decoding device suitable for an OvXDM system, wherein the OvXDM system is an OvTDM system, an OvFDM system, an OvCDM system, an OvSDM system, or an OvHDM system.

Beneficial effects of the present application are as follows:

According to the forward and backward smooth decoding method and device suitable for an OvXDM system, and the OvXDM system, a statistical idea is introduced into a decoding process, and mutual information between particles is fully utilized by using the forward smoothing process and the backward smoothing process, so as to implement decoding in the OvXDM system, such that the obtained decoding sequence is more approximate to a real value. In addition, compared with a conventional decoding method, as a total number of times of overlapping increases, decoding complexity decreases, thus decoding efficiency and system performance are improved.

DESCRIPTION OF EMBODIMENTS

The following section further describes the present application in detail with reference to specific embodiments and accompanying drawings.

A forward step and a backward step are used in the embodiments of the present invention. In subsequent embodiments, the forward step may include a forward smoothing step or a forward filtering step, and the backward step may include a backward smoothing step or a backward filtering step.

The present application provides a forward and backward smooth decoding method and device suitable for an OvXDM system, and the OvXDM system. The OvXDM system is an overlapped time division multiplexing (OvTDM) system, an overlapped frequency division multiplexing (OvFDM) system, an overlapped code division multiplexing (OvCDM) system, an overlapped space division multiplexing (OvSDM) system, or an overlapped hybrid division multiplexing (OvHDM) system.

Using the OvTDM system as an example, firstly, a transmitting end and a receiving end of the system are briefly described.

Figures 1, 2:
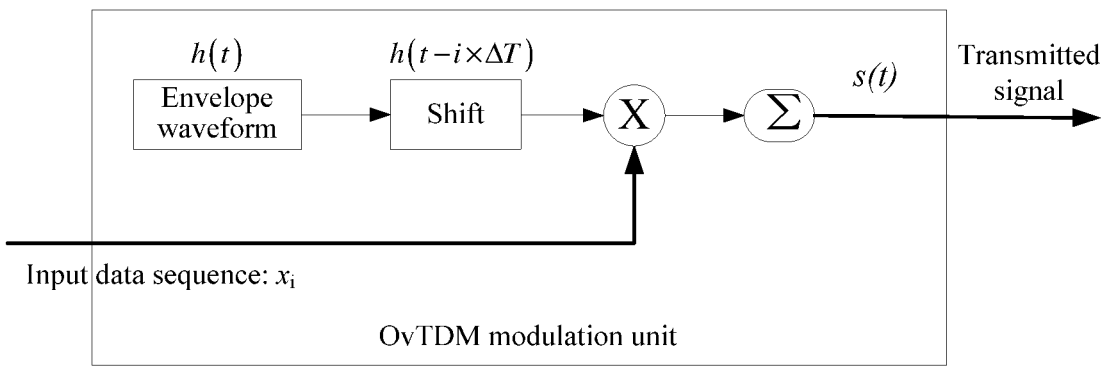
FIG. 1 is a schematic structural diagram of a transmitting end in a conventional OvTDM system.
FIG. 2 is a schematic diagram of a parallelogram rule for performing overlapped multiplexing and coding on input symbols in an OvTDM system.

FIG. 1 shows a transmitting process of the OvTDM transmitting end. Specific steps are described as follows:

(1) Firstly, generating an envelope waveform h(t) of a transmitting signal.

(2) Shifting the envelope waveform h(t) generated in the step (1) by a predetermined time interval, to generate envelope waveforms h(t−i×ΔT) of a to-be-transmitted signal at various moments.

(3) Multiplying a to-be-transmitted symbol $x_i$ by the envelope waveforms h(t−i×ΔT) of corresponding moments that are generated in the step (2), to obtain to-be-transmitted waveforms $x_i$h(t−i×ΔT) at various moments.

(4) Superimposing the to-be-transmitted waveforms $x_i$h(t−i×ΔT) generated in the step (3), to generate a waveform of the transmitting signal. The transmitting signal may be represented as $$s(t) = \sum_i x_i h(t - i \times \Delta T).$$

An overlapped multiplexing method follows a parallelogram rule shown in FIG. 2.

The transmitting end transmits an encoded and modulated signal by using an antenna. The signal is transmitted in a wireless channel The receiving end performs matched filtering on the received signal, then performs sampling and decoding on the signal, and finally performs a judgment operation on the signal and outputs a bit stream.

Figure 3A:
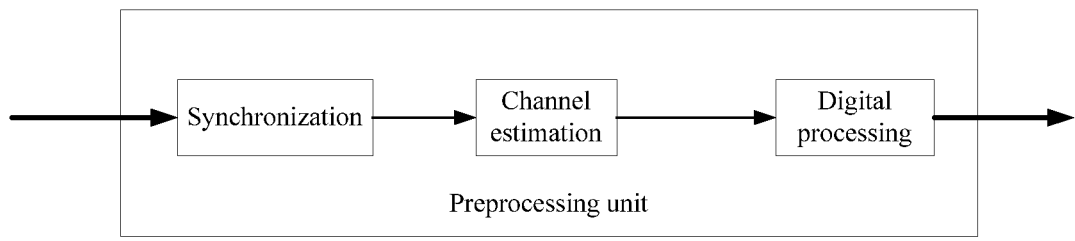
FIGS. 3 (*a*) and (*b*) are respectively a preprocessing unit and a sequence detection unit of a receiving end in a conventional OvTDM system.
Figure 3B:
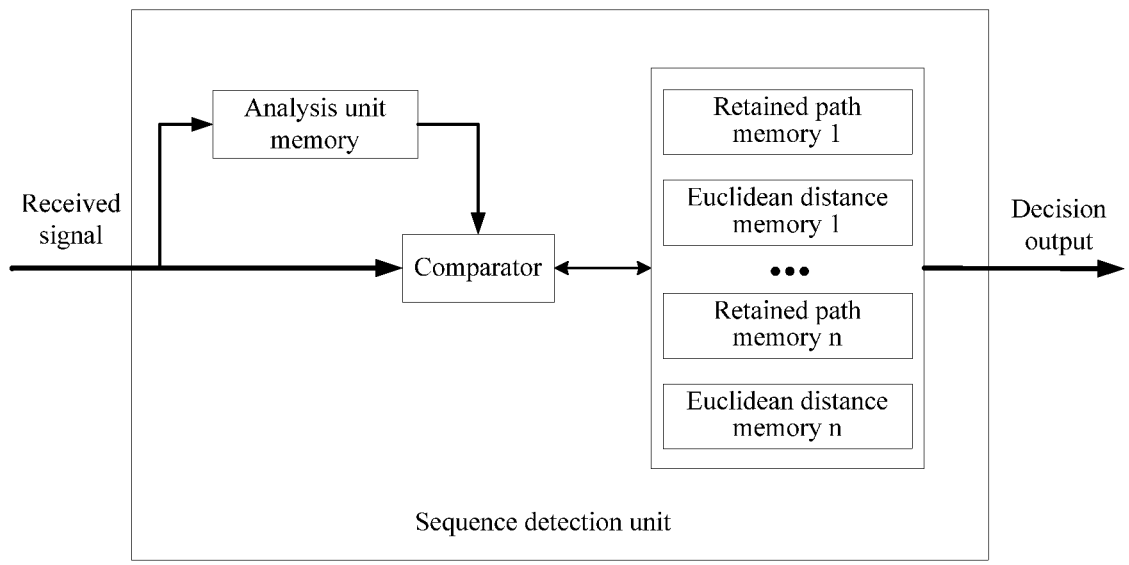

FIG. 3 shows a receiving process of the receiving end in the OvTDM system. FIG. 3 (*a*) shows a preprocessing unit of the receiving end in the OvTDM system, and FIG. 3 (*b*) shows a sequence detection unit of the receiving end in the OvTDM system. Specific steps are described as the following section.

(5) Firstly, synchronizing the received signal, wherein the synchronization operation includes carrier synchronization, frame synchronization, symbol synchronization, time synchronization, and the like.

(6) Performing digital processing on the received signal in each frame based on a sampling theorem.

(7) Segmenting a received waveform based on a waveform transmission time interval.

(8) Decoding the waveform obtained after segmenting based on a decoding algorithm. For example, performing the decoding operation by Viterbi decoding.

Figure 4:
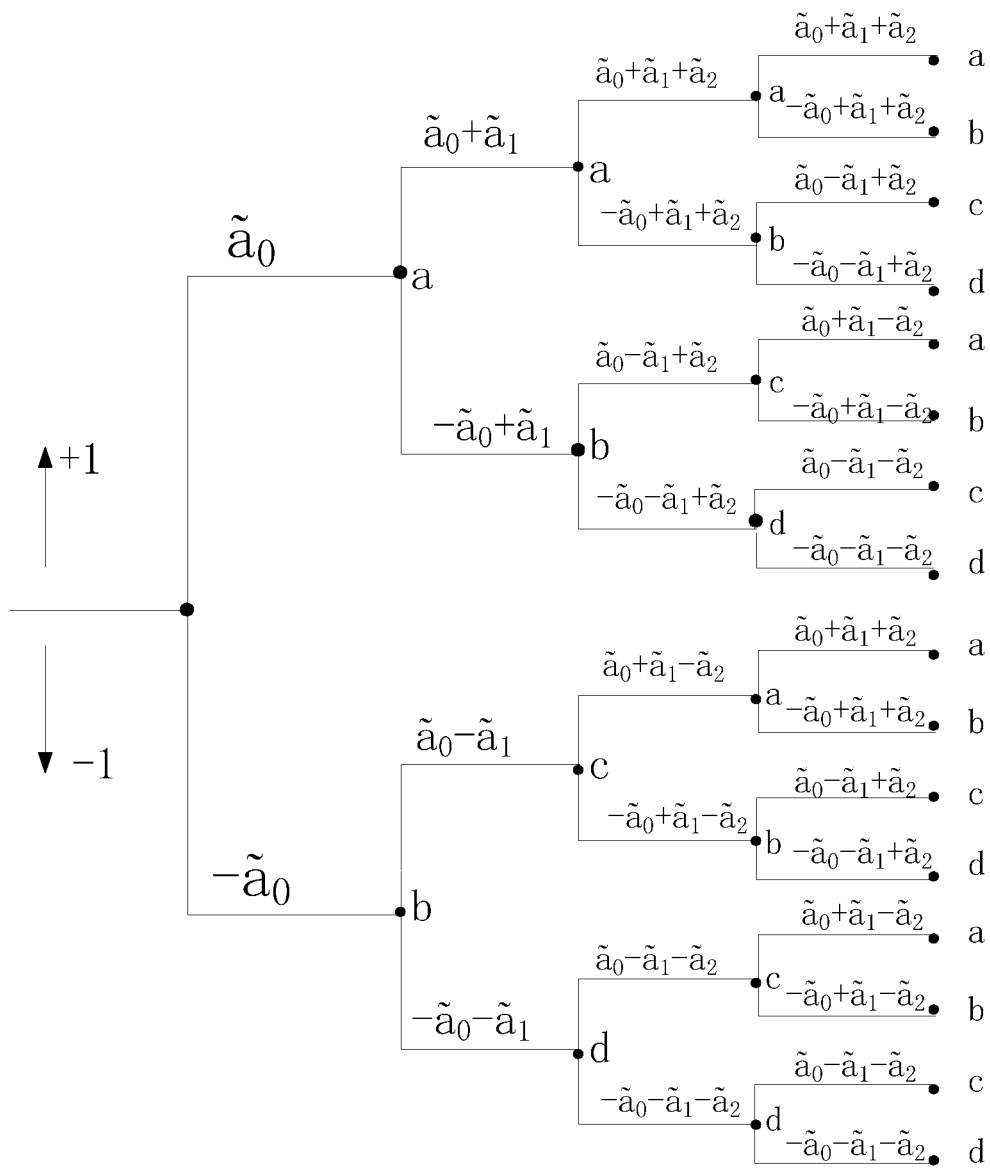
FIG. 4 is an input-output code tree diagram of a system when a total number K of times of overlapped multiplexing of the system is 3.
Figure 5:
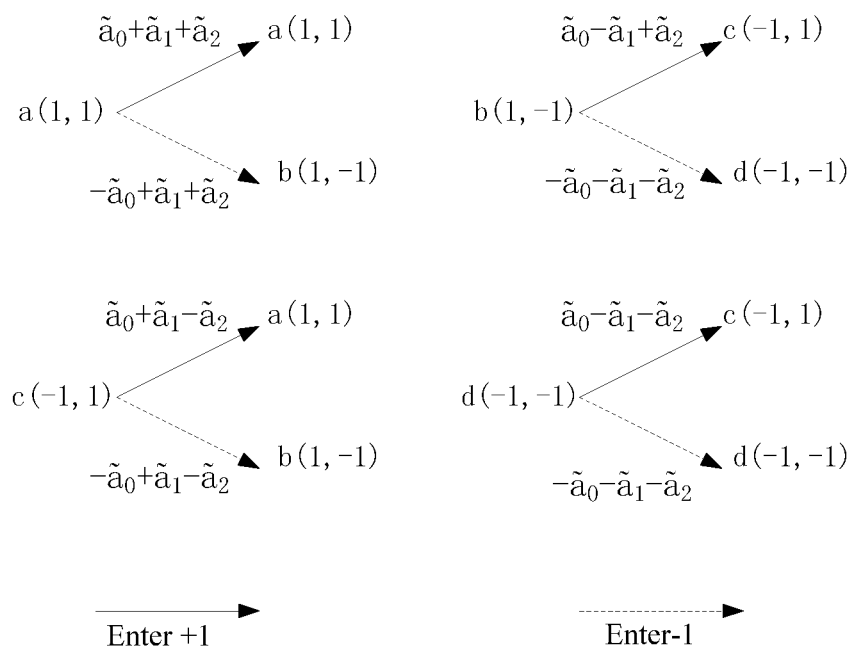
FIG. 5 is a node state transition diagram of a system corresponding to FIG. 4.
Figure 6:
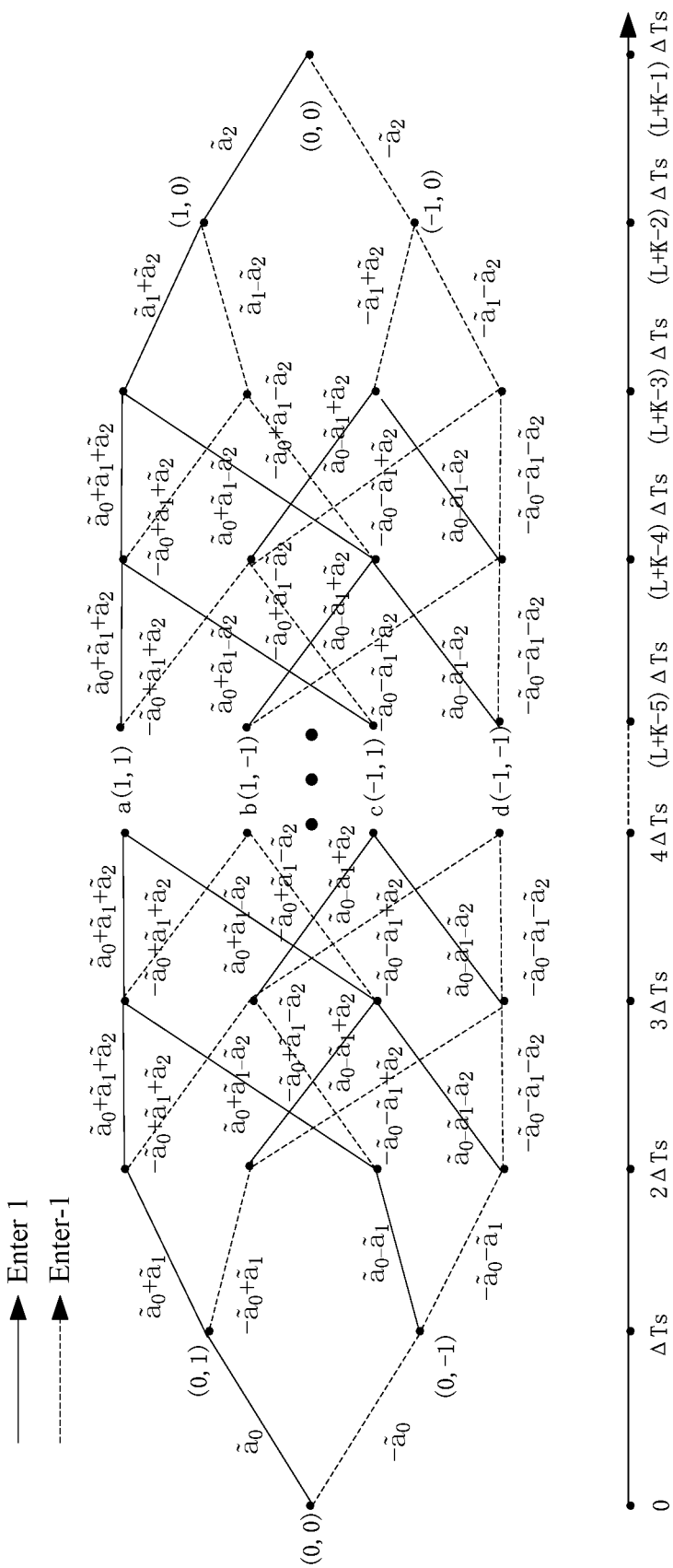
FIG. 6 is a trellis (Trellis) diagram of a system corresponding to FIG. 4 or FIG. 5.

For the decoding process, referring to FIG. 4 to FIG. 6. FIG. 4 is an input-output code tree diagram of the system when a total number K of times of overlapped multiplexing is 3. FIG. 5 is a corresponding node state transition diagram of the system. FIG. 6 is a Trellis diagram of the system.

As describe above, in a conventional decoding method (for example, the typical Viterbi decoding), as a total number of times of overlapping increases, decoding complexity increases sharply, a requirement for the precision of hardware is relatively high, and system performance is reduced. To solve this problem, through research and practice, the inventor introduces a statistical idea into a decoding process, and fully utilizes mutual information between particles by using a forward smoothing process and a backward smoothing process, to implement decoding in an OvXDM system, such that an obtained decoding sequence is more approximate to a real value. In addition, compared with the conventional decoding method, as a total number of times of overlapping increases, decoding complexity decreases, and decoding efficiency and system performance are improved. The following section firstly describes an inventive concept and a principle of the present application.

In one embodiment, a decoding process mainly includes a forward smoothing process and a backward smoothing process.

A principle of the forward smoothing process is the same as a principle of the Monte Carlo methods. The Monte Carlo methods are a class of important numerical computation algorithms in statistics that rely on probabilistic statistics theory. Their essential idea is: when a problem to be solved is an occurring probability of a random event or an expected value of a random variable, estimating the probability of the random event based on an "experiment" method and occurring frequency of the event, or obtaining some digital characteristics of the random variable, and using the probability or the digital characteristics as a solution of the problem. The Monte Carlo methods in statistics are correspondingly referred to as Particle Filter (PF) in engineering. An idea of the particle filter represents a probability by using a particle set based on the Monte Carlo methods. The particle filter may be applied to a state space model in any form, and can relatively and accurately reflect posterior probability distribution based on an observed quantity and a controlled quantity. A core idea of the particle filter reflects posterior probability distribution by using random state particles sampled from posterior probabilities, which is sequential importance sampling. Therefore, the particle filter is a process in which a group of random samples propagated in state space are found to approximately represent a probability density function, and a sample mean is used to replace an integral operation, so as to obtain a minimum variance estimation of system states. These samples are vividly referred to as "particles", and therefore the process is referred to as the particle filter. When a quantity of samples tends to be infinitely large, the distribution may be approximate to probability density distribution in any form.

The backward smoothing process is performed after the forward smoothing process. Smoothing processing is performed on estimation particles again in a backward sequence based on a sequence estimated in forward smoothing and a corresponding weight of the particle thereof, to obtain a more real estimation sequence.

Therefore, to sum up, a forward-backward smoothing (FBS) process is represented as the following expression:

$$p(x_t | y_{1:T}) = p(x_t | y_{1:t}) \int \frac{p(x_{t+1} | y_{1:T}) p(x_{t+1} | x_t)}{p(x_{t+1} | y_{1:t})} dx_{t+1};$$

wherein $p(x_t|y_{1:t})$ is filtering density a moment t, $p(x_{t+1}|y_{1:t})$ is forward predicting density at a moment t. Based on the aforementioned formula, it is started from $p(x_T|y_{1:T})$, $p(x_t|y_{1:T})$ to $p(x_{t+1}|y_{1:t})$ are repeatedly obtained. By repeatedly performing iterative operation in the aforementioned section, marginal smooth distribution may be approximately described by using a weight particle cloud. A forward particle filter may be represented as $$\hat{P}(dx_t | y_{1:t}) = \sum_{i=1}^{Ns} \omega_t^{(i)} \delta_{x_t^{(i)}}(dx_t),$$

and backward smooth distribution is represented as $$\hat{P}(dx_t | y_{1:T}) = \sum_{i=1}^{N} \omega_{t|T}^{(i)} \delta_{x_t^{(i)}}(dx_t),$$

wherein a smooth weight is calculated by repeatedly iterating based on the following formula:

$$\omega_{t|T}^{(i)} = \omega_t^{(i)} \sum_{j=1}^{Ns} \left[ \omega_{t+1|T}^{(j)} \frac{p(x_{t+1}^{(j)} | x_t^{(i)})}{\sum_{k=1}^{Ns} p(x_{t+1}^{(j)} | x_t^{(k)}) \omega_t^{(k)}} \right];$$

wherein $\omega_{T|T}^{(i)} = \omega_T^{(i)}$.

The aforementioned section describes principle of the forward smoothing process and the backward smoothing process. The following section describes the forward smoothing process and the backward smoothing process in detail.

1. Forward smoothing process:

(1) Constructing a particle set $x_t^{(i)} \sim q(x_t|y_t, x_{t-1}^{(i)}, \phi)$, wherein $x_{0:t}^{(i)} = [x_{0:t-1}^{(i)}, x_t^{(i)}]$, (2) Calculating an importance weight $\tilde{w}_t^{(i)}$ of each particle in the particle set, wherein $\tilde{w}_t^{(i)} \propto w_t(w_{t-1:t}^{(i)}) q(y_t|x_{t-1}^{(i)}, \phi)$, and $\tilde{w}_t^{(i)}$ satisfies $$\sum_{i=1}^{Ns} \tilde{w}_t^{(i)} = 1.$$

(3) if the particle set satisfies a predetermined condition, performing a resampling operation on the particle set according to a formula $$x_{0:t}^{(i)} \sim \sum_{i=1}^{N} \tilde{w}_t^{(i)} \delta(x_{0:t}^{(i)}),$$

to obtain a new particle set.

In the aforementioned forward smoothing process, t≥1, and a value of i ranges from 1 to Ns. By repeatedly performing iterative operation in aforementioned forward smoothing process, particle distribution that is more approximate to a real sequence is finally obtained.

2. Backward smoothing process:

As described above, the backward smoothing is performed according to the forward smoothing. The smoothing process is performed on the estimation particles again in the backward sequence based on the sequence estimated in the forward smoothing and the corresponding weight of the particle thereof, to obtain the more real estimation sequence.

(4) FBS initialization

Setting $p(x_0|x_{-1}) = p(x_0)$, wherein $x_0^{(i)} \sim p(x_0)$, i−1~N.

(5) Calculating probability density $p(x_{t+1}^{(j)}|x_t^{(k)})$ between a current symbol and a next symbol.

(6) Calculating a normalization factor $$\sum_{k=1}^{Ns} p(x_{t+1}^{(j)} | x_t^{(k)}) \omega_t^{(k)},$$

wherein $\omega_t^{(k)}$ is calculated in the forward smoothing process.

(7) Calculating a backward smooth weight $\omega_{t|T}^{(i)}$. Specifically, calculating a weight of each particle in the backward smoothing process based on a formula $$\omega_{t|T}^{(i)} = \omega_t^{(i)} \sum_{j=1}^{Ns} \left[ \omega_{t+1|T}^{(j)} \frac{p(x_{t+1}^{(j)} | x_t^{(i)})}{\sum_{k=1}^{Ns} p(x_{t+1}^{(j)} | x_t^{(k)}) \omega_t^{(k)}} \right].$$

(8) Selecting, based on a predetermined rule, a closest particle as an estimated value of the current symbol. For example, a particle, having a maximum weight, is regarded as the estimated value.

(9) Repeating steps (5) to (8), until estimated values of all symbols are calculated, and the backward smoothing process ends. A sequence formed by the estimated values of the symbols is a final decoding sequence.

The aforementioned section describes the concept and the principle of the forward and backward smooth decoding method and device suitable for an OvXDM system, and the OvXDM system of the present application. The following section describes the present application in detail.

Figure 7:
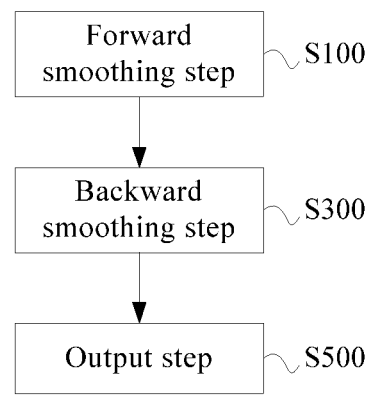
FIG. 7 is a schematic flowchart of a forward and backward smooth decoding method suitable for an OvXDM system according to an embodiment of the present application.
Figure 8:
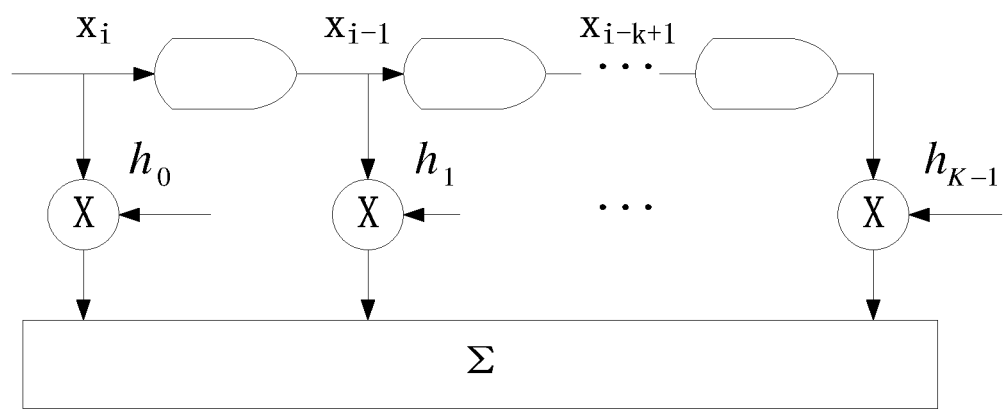
FIG. 8 is a diagram of an equivalent convolutional coding model of an OvXDM system.

In one embodiment, referring to FIG. 7, the forward and backward smooth decoding method suitable for an OvXDM system disclosed in the present application includes a forward smoothing step S100, a backward smoothing step S300, and an output step S500. The OvXDM system may be an OvTDM system, an OvFDM system, an OvCDM system, an OvSDM system, or an OvHDM system. FIG. 8 shows an equivalent convolutional coding model of the OvXDM system.

Forward smoothing step S100: Starting from the first symbol to the last symbol in an estimation sequence, sequentially calculating importance weights of particles in a particle set corresponding to each symbol, to obtain importance weights of particles in a forward smoothing process. Specifically, referring to FIG. 9, the forward smoothing step S100 includes steps S101 to S109.

Step S101: Initializing the estimation sequence X. Because this is in the forward smoothing process, the estimation sequence X is regarded as a forward smoothing estimation sequence Xf, wherein a length of the estimation sequence X is the same as a length of a to-be-decoding sequence. For example, it is assumed that a receiving end of the OvXDM system receives a symbol sequence y whose length is N, the symbol sequence y is the to-be-decoding sequence. A total number of times of overlapping of the symbol sequence is K, and a rectangular wave is used as a multiplexing waveform. If a quantity of particles of each symbol is Ns, each particle is corresponding to a value of the importance weight. Therefore, a size of the forward smoothing estimation sequence Xf is Ns×N, and a size of a set Wf of importance weight values corresponding to particles is Ns×N.

Step S103: Starting from the first symbol to the last symbol in the forward smoothing estimation sequence Xf, generating a particle set that is corresponding to a current symbol. As described above, a quantity of particles in the particle set corresponding to each symbol is Ns. For example, in the OvXDM system, a binary data flow {+1, −1} is used as an example, there are only two possible values of each symbol: +1 or −1. Therefore, the particle set corresponding to each symbol includes two types of particles whose values are respectively +1 and −1. There are many methods for generating the particle set corresponding to the current symbol, the method is qualified if distribution of the generated particle set is approximate to theoretical distribution.

Step S105: After the particle set is generated for the current symbol, calculating importance probabilistic density between each particle of the current symbol and the to-be-decoding sequence, and calculate an importance weight of each particle. In one embodiment, the importance weight of each particle in the particle set corresponding to the current symbol is calculated according to the following formula:

$$wf_{i,j} = \frac{P_{i,j}}{\sum_{j=1}^{Ns} P_{i,j}} \quad (i = 1 \sim N, j = 1 \sim Ns);$$

Wherein $wf_{i,j}$ is importance weight of the particle, N is the length of the to-be-decoding sequence, Ns is a quantity of particles in the particle set corresponding to the current symbol, and $P_{i,j}$ is the importance probabilistic density of the particle. It can be learned that $wf_{i,j}$ is actually a normalized importance weight of the particle.

In one embodiment, when i>1, that is, when the current symbol is the second symbol or a subsequent symbol, importance probabilistic density between a particle in the particle set of the current symbol and the to-be-decoding sequence may be calculated with reference to importance probabilistic density between a particle in the particle set of a previous symbol and the to-be-decoding sequence.

It should be noted that, in the OvXDM system, because the received symbol sequence y is performed by OvXDM coding, OvXDM coding also needs to be performed on an estimation symbol $Xf_{i,j}$, and then importance probabilistic density of the estimation symbol is calculated.

After importance weights of all particles in the particle set corresponding to the current symbol are calculated, step S107 is performed.

Step S107: Determining whether a particle set corresponding to the current symbol satisfies a predetermined particle degenerating condition; and if the particle set does not satisfy the predetermined particle degenerating condition, proceeding to a next symbol, that is, starting to perform step S103 on the next symbol; or if the particle set satisfies the predetermined particle degenerating condition, performing step S109. Step S107 is used to determine whether the particles in the particle set corresponding to the current symbol are subject to a significant degenerating phenomenon. For example, if an effective particle capacity $$\hat{N}_{eff} = \frac{1}{\sum_{j=1}^{Ns} (Wf_{i,j})^2}$$

of the particle set corresponding to the symbol is smaller than a predetermined threshold, a resampling operation needs to be performed on the particle set corresponding to the symbol. It should be noted that, the particle set failing to satisfy the predetermined particle degenerating condition means that the particle set corresponding to the current symbol is not subject to a serious degenerating phenomenon; and the particle set satisfying the predetermined particle degenerating condition means that the particle set corresponding to the current symbol is subject to a serious degenerating phenomenon, and therefore The resampling operation needs to be performed on the particle set.

Figure 10:
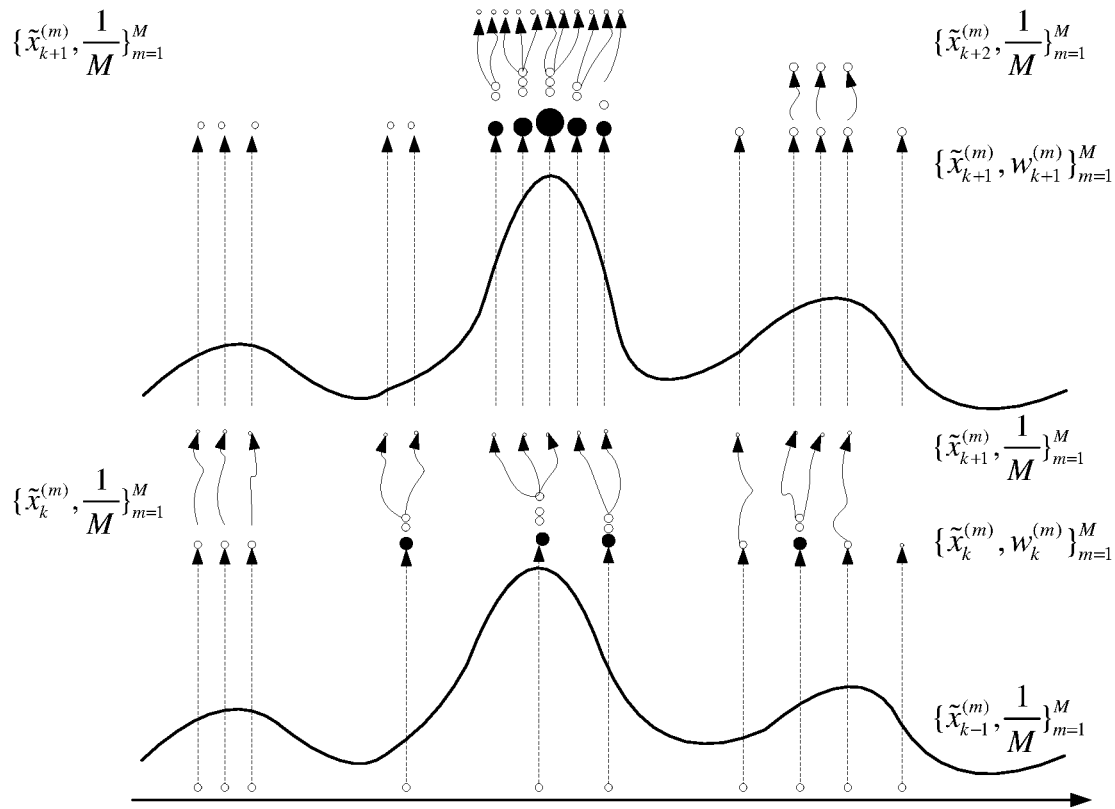
FIG. 10 is a schematic diagram of a resampling step according to an embodiment of the present application.

Step S109: Performing a resampling operation on the particle set of the current symbol. The resampling operation is performed to delete particles having small weights and reserve particles having large weights, so as to eliminate the degenerating phenomenon. There are a plurality of resampling methods, including importance resampling, residual resampling, stratified resampling, and optimization and combination resampling. A basic idea of resampling is to replicate particles having large weights and eliminate particles having small weights. A new particle set is finally generated by resampling. A schematic diagram of a resampling operation is shown in FIG. 10.

Figure 9:
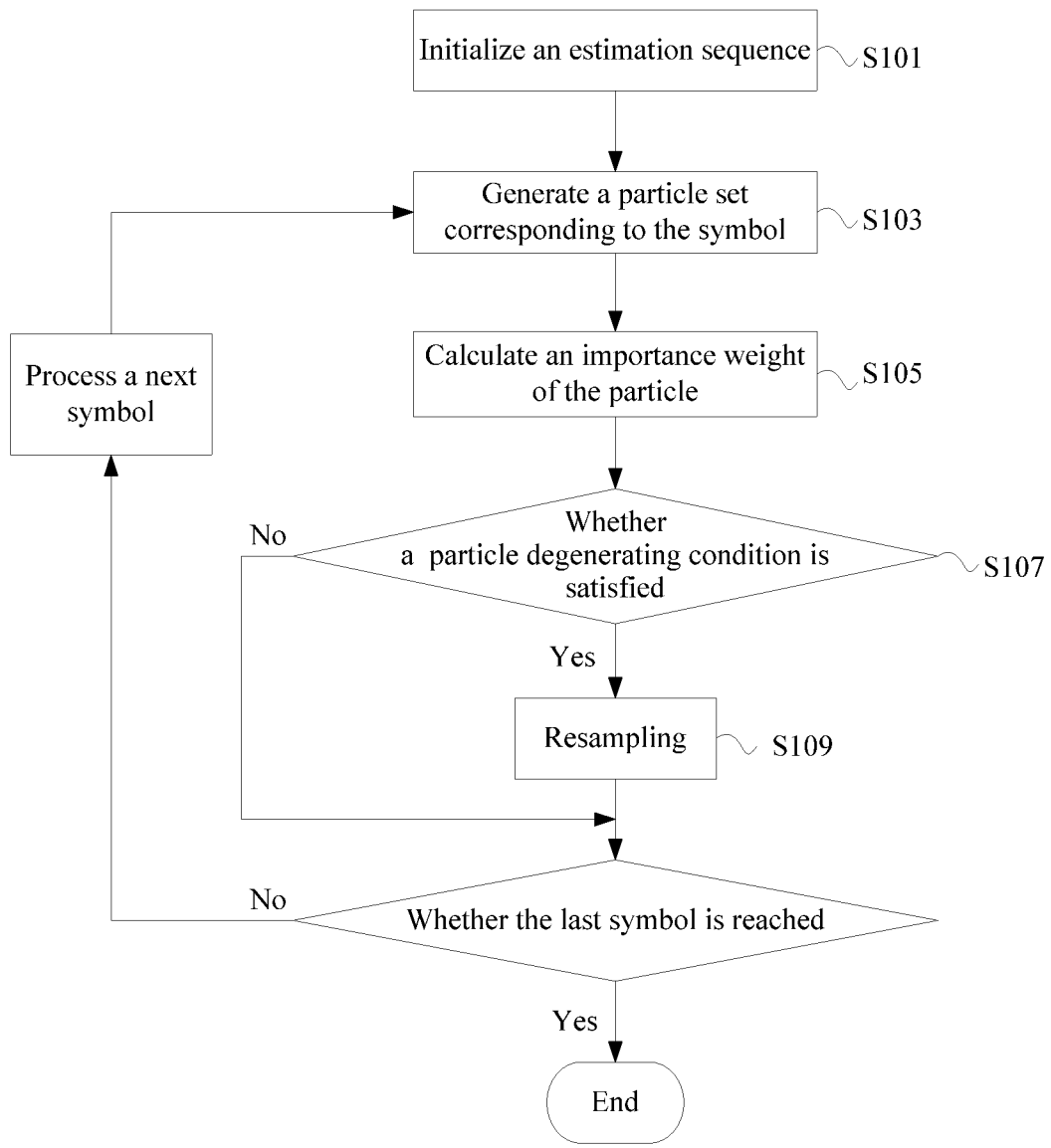
FIG. 9 is a schematic flowchart of a forward smoothing step according to an embodiment of the present application.

In addition, in specific implementation, the "starting from the first symbol to the last symbol in the forward smoothing estimation sequence Xf" mentioned in step S103 may be: starting from the first symbol, performing step S101; if a determining result of step S107 is that the particle set corresponding to the current symbol does not satisfy the predetermined particle degenerating condition, or after the step S109, determining whether the last symbol is reached; and if the last symbol is reached, the forward smoothing step S100 ends; otherwise, going to the next symbol, that is, performing step S103 on the next symbol, and continuing to perform subsequent steps according to a process shown in FIG. 9.

After the forward smoothing step S100, namely, steps S101 to S109, symbols in the estimation sequence X (the forward smoothing estimation sequence Xf) have corresponding particle sets, and each particle in the particle sets has an importance weight.

Figure 11:
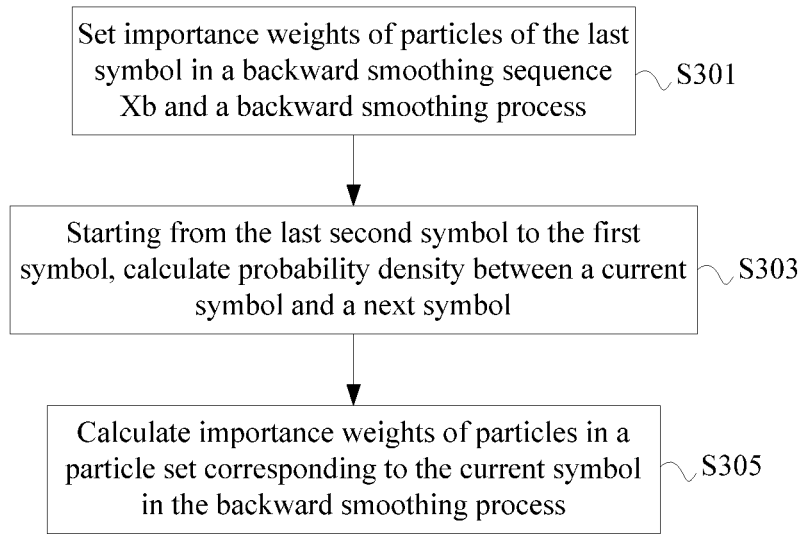
FIG. 11 is a schematic flowchart of a backward smoothing step according to an embodiment of the present application.

Backward smoothing step S300: Starting from the last symbol to the first symbol in the estimation sequence X (the forward smoothing estimation sequence Xf), sequentially calculating importance weights of particles in a particle set corresponding to each symbol with reference to the importance weights of particles obtained in the forward smoothing step S100, to obtain importance weights of particles in a backward smoothing process. In one embodiment, referring to FIG. 11, the backward smoothing step S300 includes steps S301 to S305.

Step S301: Based on a calculation result of the forward smoothing step S100, regarding a particle that has a maximum importance weight in a particle set corresponding to the last symbol in the estimation sequence X (the forward smoothing estimation sequence Xf), as an estimated value of the last symbol; and regarding importance weights of particles in the particle set corresponding to the last symbol in the estimation sequence X (the forward smoothing estimation sequence Xf) in the forward smoothing process, as importance weights of the corresponding particles in the particle set corresponding to the last symbol in the estimation sequence X (the forward smoothing estimation sequence Xf) in the backward smoothing process. In one embodiment, a backward smoothing sequence Xb may alternatively be set, wherein a length of the sequence is N. The particle that has the maximum importance weight in the particle set corresponding to the last symbol in the estimation sequence X (the forward smoothing estimation sequence Xf) is regarded as an estimated value of the last symbol in the backward smoothing sequence Xb. This may be represented in the following form: Xb(N)=Xf (max, N). In addition, the importance weights of the particles in the particle set corresponding to the last symbol in the estimation sequence X (the forward smoothing estimation sequence Xf) are assigned to importance weights Wb of the backward smoothing sequence Xb. This may be represented as Wb(1~Ns, N)=Wf(1~Ns, N).

Step S303: Starting from the last second symbol to the first symbol in the estimation sequence X, calculating probability density $p(x_{t+1}^{(j)}|x_t^{(k)})$ between a current symbol and a next symbol. It should be noted that the sequence estimated in the forward smoothing process is not encoded; therefore, K times of OvXDM coding need to be performed on a multiplexing waveform and each of a symbol at a current moment and a symbol at a next moment, and then probability density is calculated. In this case, multivariate normal probability density function (MVNPDF) is used.

Step S305: Calculating importance weights of particles of the current symbol in the backward smoothing process based on the probability density calculated in step S303, importance weights of particles of the next symbol in the backward smoothing process, and importance weights of particles of the current symbol in the forward smoothing process. In one embodiment, a normalization factor $$\sum_{k=1}^{N} p(x_{t+1}^{(j)}|x_t^{(k)})\omega_t^{(k)}$$

may be firstly calculated, wherein $\omega_t^{(k)}$ is a result obtained by calculating in the forward smoothing step S100. In one embodiment, the importance weights of the particles in the particle set corresponding to the current symbol are calculated according to the following formula:

$$\omega_{t|T}^{(i)} = \omega_t^{(i)} \sum_{j=1}^{Ns} \left[ \omega_{t+1|T}^{(j)} \frac{p(x_{t+1}^{(j)}|x_t^{(i)})}{\sum_{k=1}^{Ns} p(x_{t+1}^{(j)}|x_t^{(k)})\omega_t^{(k)}} \right];$$

wherein Ns is a quantity of particles, i and j represent particle indexes and range from 1 to Ns, and $x_t^{(k)}$ represents a $k^{th}$ particle of a symbol at a moment t; and $\omega_t$ represents importance weights of particles of the current symbol in the forward smoothing process, $p(x_{t+1}^{(j)}|x_t^{(k)})$ is the probability density between the current symbol and the next symbol, and $\omega_{t|T}$ represents importance weights of particles of the current symbol in the backward smoothing process.

Certainly, an implementation of the "starting from the last second symbol to the first symbol in the estimation sequence X" mentioned in step S303 may alternatively be similar to the implementation of the "starting from the first symbol to the last symbol in the forward smoothing estimation sequence Xf" mentioned in step S103. Details are not described herein again.

Step S500: regarding a particle that has a maximum importance weight in a particle set corresponding to each symbol in the backward smoothing process, as an estimated value of the symbol; and outputting a final decoding sequence. In other words, a particle that has a maximum importance weight in a particle set corresponding to each symbol in the estimation sequence X in the backward smoothing process is used as an estimated value of the symbol; and a final decoding sequence is outputted.

Figure 12:
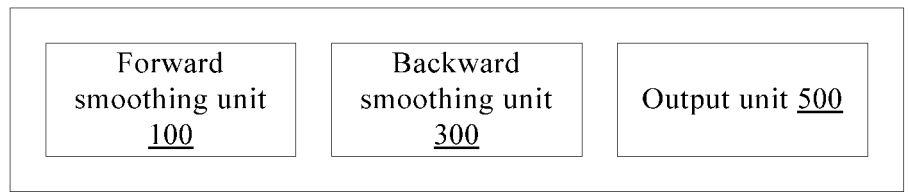
FIG. 12 is a schematic structural diagram of a forward and backward smooth decoding device suitable for an OvXDM system according to an embodiment of the present application.

The aforementioned section describes a procedure of the forward and backward smooth decoding method suitable for an OvXDM system disclosed in the present application. Correspondingly, the present application further discloses an OvXDM system. The OvXDM system may be an OvTDM system, an OvFDM system, an OvCDM system, an OvSDM system, or an OvHDM system. The OvXDM system includes a forward and backward smooth decoding device suitable for an OvXDM system. Referring to FIG. 12, the forward and backward smooth decoding device suitable for an OvXDM system includes a forward smoothing unit 100, a backward smoothing unit 300, and an output unit 500.

Figure 13:
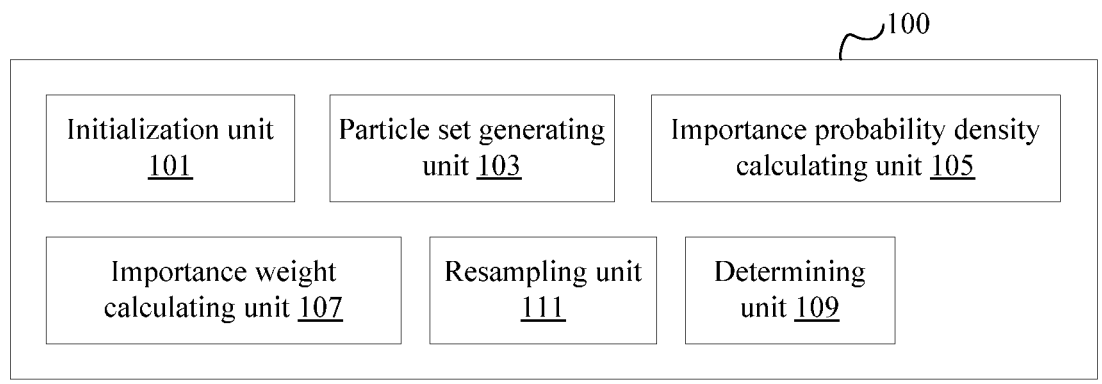
FIG. 13 is a schematic structural diagram of a forward smoothing unit according to an embodiment of the present application.

The forward smoothing unit 100 is configured to: starting from the first symbol to the last symbol in an estimation sequence, sequentially calculate importance weights of particles in a particle set corresponding to each symbol, to obtain importance weights of particles in a forward smoothing process. In one embodiment, referring to FIG. 13, the forward smoothing unit 100 includes an initialization unit 101, a particle set generating unit 103, an importance probabilistic density calculating unit 105, an importance weight calculating unit 107, a determining unit 109, and a resampling unit 111.

The initialization unit 101 is configured to initialize the estimation sequence X, wherein a length of the estimation sequence X is the same as a length of a to-be-decoding sequence. Because this is in the forward smoothing process, the estimation sequence X is regarded as a forward smoothing estimation sequence Xf, wherein a length of the estimation sequence X is the same as the length of the to-be-decoding sequence. For example, it is assumed that a receiving end of the OvXDM system receives a symbol sequence y whose length is N, the symbol sequence y is the to-be-decoding sequence. A total number of times of overlapping of the symbol sequence is K, and a rectangular wave is used as a multiplexing waveform. If a quantity of particles of each symbol is Ns, each particle is corresponding to a value of the importance weight. Therefore, a size of the forward smoothing estimation sequence Xf is Ns×N, and a size of a set Wf of importance weight values corresponding to particles is Ns×N.

The particle set generating unit 103 is configured to: starting from the first symbol to the last symbol in the estimation sequence X, generate a particle set that is corresponding to a current symbol. As described above, the quantity of particles in the particle set corresponding to each symbol is Ns. For example, in the OvXDM system, a binary data flow {+1, −1} is used as an example, there are only two possible values of each symbol: +1 or −1. Therefore, the particle set corresponding to each symbol includes two types of particles whose values are respectively +1 and −1. There are many methods for generating the particle set corresponding to the current symbol, the method is qualified if distribution of the generated particle set is approximate to theoretical distribution.

The importance probabilistic density calculating unit 105 is configured to: after the particle set is generated for the current symbol, calculate importance probabilistic density between each particle of the current symbol and the to-be-decoding sequence. In one embodiment, when i>1, that is, when the current symbol is the second or a subsequent symbol, the importance probabilistic density calculating unit 105 may calculate importance probabilistic density between a particle in the particle set of the current symbol and the to-be-decoding sequence with reference to importance probabilistic density between a particle in a particle set of a previous symbol and the to-be-decoding sequence. In the OvXDM system, because the received symbol sequence y has undergone OvXDM coding, OvXDM coding also needs to be performed on an estimation symbol $Xf_{i,j}$, and then importance probabilistic density of the symbol is calculated.

The importance weight calculating unit 107 is configured to calculate an importance weight of each particle based on the importance probabilistic density. In one embodiment, the importance weight calculating unit 107 calculates the importance weight of each particle in the particle set corresponding to the current symbol based on the following formula:

$$wf_{i,j} = \frac{P_{i,j}}{\sum_{j=1}^{Ns} P_{i,j}} \quad (i = 1 \sim N, j = 1 \sim Ns);$$

Wherein $wf_{i,j}$ is importance weight of the particle, N is the length of the to-be-decoding sequence, Ns is a quantity of particles in the particle set corresponding to the current symbol, and $P_{i,j}$ is the importance probabilistic density of the particle. It can be learned that $wf_{i,j}$ is actually a normalized importance weight of the particle.

The determining unit 109 is configured to: determine whether a particle set corresponding to the current symbol satisfies a predetermined particle degenerating condition; and if the particle set does not satisfy the predetermined particle degenerating condition, notify the particle set generating unit 103 to generate a particle set corresponding to a next symbol. The determining unit 109 is configured to determine whether the particles in the particle set corresponding to the current symbol are subject to a significant degenerating phenomenon. For example, it may be set that a resampling operation needs to be performed on a particle set corresponding to a symbol when an effective particle capacity $$\hat{N}_{eff} = \frac{1}{\sum_{j=1}^{Ns} (Wf_{i,j})^2}$$

of the particle set corresponding to the symbol is smaller than a predetermined threshold.

The resampling unit 111 is configured to: if the determining unit 109 determines that the particle set corresponding to the current symbol satisfies the predetermined particle degenerating condition, perform a resampling operation on the particle set of the current symbol. The resampling unit 111 performs a resampling operation to delete particles having small weights and reserve particles having large weights, so as to eliminate the degenerating phenomenon. There are a plurality of resampling methods, including importance resampling, residual resampling, stratified resampling, and optimization and combination resampling. A basic idea of resampling is to replicate particles having large weights and eliminate particles having small weights. A new particle set is finally generated by resampling. A schematic diagram of resampling is shown in FIG. 10. After performing resampling on the particle set of the current symbol, the resampling unit 111 notifies the particle set generating unit 103 to generate a particle set corresponding to the next symbol.

Figure 14:
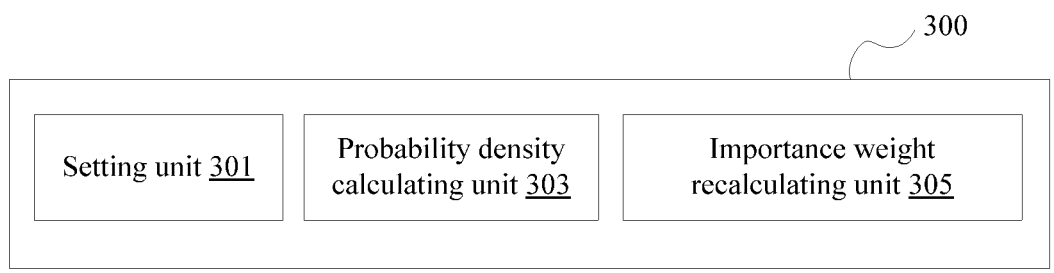
FIG. 14 is a schematic structural diagram of a backward smoothing unit according to an embodiment of the present application.

The backward smoothing unit 300 is configured to: starting from the last symbol to the first symbol in the estimation sequence X (the forward smoothing estimation sequence Xf), sequentially calculate importance weights of particles in a particle set corresponding to each symbol with reference to the importance weights of particles obtained by the forward smoothing unit 100, to obtain importance weights of particles in a backward smoothing process. In one embodiment, referring to FIG. 14, the backward smoothing unit 300 includes a setting unit 301, a probability density calculating unit 303, and an importance weight recalculating unit 305.

The setting unit 301 is configured to: based on a calculation result of the forward smoothing unit 100, regard a particle that has a maximum importance weight in a particle set corresponding to the last symbol in the estimation sequence X (the forward smoothing estimation sequence Xf), as an estimated value of the last symbol; and regard importance weights of particles in the particle set corresponding to the last symbol in the estimation sequence X (the forward smoothing estimation sequence Xf) in the forward smoothing process, as importance weights of the corresponding particles in the particle set corresponding to the last symbol in the estimation sequence X in the backward smoothing process. In one embodiment, a backward smoothing sequence Xb may alternatively be set, wherein a length of the sequence is N. The setting unit 301 regards the particle that has the maximum importance weight in the particle set corresponding to the last symbol in the estimation sequence X (the forward smoothing estimation sequence Xf), as an estimated value of the last symbol in the backward smoothing sequence Xb. This may be represented in the following form: $Xb(N) = Xf$ (max, N). In addition, the setting unit 301 assigns the importance weights of the particles in the particle set corresponding to the last symbol in the estimation sequence X (the forward smoothing estimation sequence Xf), to importance weights Wb of the backward smoothing sequence Xb. This may be represented as Wb(1~Ns, N)=Wf(1~Ns, N).

The probability density calculating unit 303 is configured to: starting from the last second symbol to the first symbol in the estimation sequence, calculate probability density $p(x_{t+1}^{(j)}|x_t^{(k)})$ between a current symbol and a next symbol. It should be noted that the sequence estimated in the forward smoothing process is not encoded; therefore, K times of OvXDM coding need to be performed on a multiplexing waveform and each of a symbol at a current moment and a symbol at a next moment, and then probability density is calculated. In this case, multivariate normal probability density function (MVNPDF) is used.

The importance weight recalculating unit 305 is configured to: after the probability density between the current symbol and the next symbol is calculated, calculate importance weights of particles of the current symbol in the backward smoothing process based on the probability density calculated by the probability density calculating unit 303, importance weights of particles of the next symbol in the backward smoothing process, and importance weights of particles of the current symbol in the forward smoothing process. In one embodiment, the importance weight recalculating unit 305 may firstly calculate a normalization factor $$\sum_{k=1}^{N} p(x_{t+1}^{(j)}|x_t^{(k)})\omega_t^{(k)},$$

wherein $\omega_t^{(k)}$ is a result obtained by calculating by the forward smoothing unit 100. In one embodiment, the importance weight recalculating unit 305 calculates the importance weights of the particles in the particle set corresponding to the current symbol based on the following formula:

$$\omega_{t|T}^{(i)} = \omega_t^{(i)} \sum_{j=1}^{Ns} \left[ \omega_{t+1|T}^{(j)} \frac{p(x_{t+1}^{(j)}|x_t^{(i)})}{\sum_{k=1}^{Ns} p(x_{t+1}^{(j)}|x_t^{(k)})\omega_t^{(k)}} \right];$$

wherein Ns is a quantity of particles, i and j represent particle indexes and range from 1 to Ns, and $x_t^{(k)}$ represents a kth particle of a symbol at a moment t; and $\omega_t$ is importance weights of particles of the current symbol in the forward smoothing process, $p(x_{t+1}^{(j)}|x_t^{(k)})$ is the probability density between the current symbol and the next symbol, and $\omega_{t|T}$ is importance weights of particles of the current symbol in the backward smoothing process.

The output unit 500 is configured to: regard a particle that has a maximum importance weight in a particle set corresponding to each symbol in the backward smoothing process, as an estimated value of the symbol; and output a final decoding sequence. In other words, a particle that has a maximum importance weight in a particle set corresponding to each symbol in the estimation sequence X in the backward smoothing process is used as an estimated value of the symbol; and a final decoding sequence is outputted.

The aforementioned section describes the OvXDM system and the forward and backward smooth decoding device suitable for an OvXDM system that are disclosed in the present application.

In the present application, when a particle set is generated for each particle in a decoding process, for an unknown sequence, particle distribution of the sequence is unknown at an initial stage; therefore, a group of samples may be randomly generated first; importance weights of a particle and an observed value are calculated, to determine particle reliability; resampling is performed on particle samples according to a specific criterion, to eliminate particles with small weights and replicate particles with large weights; and a relatively reliable output value is finally obtained through repeated iteration calculation. A more accurate result is obtained when a total number of times of iteration is greater. In addition, a particle degenerating phenomenon is a largest defect of a particle filter, and restricts development of the particle filter. An effective method for solving the particle degenerating problem is performing resampling on particles. The particle filter has unique advantages in terms of parameter estimation and state filtering for solving nonlinear and non-Gaussian problems, and therefore has large development space. A plurality of mature optimization methods may be introduced into a resampling process, so as to more quickly extract typical "particles" reflecting system probabilistic characteristics.

In the aforementioned embodiment, mutual information between particles is fully utilized by using the forward smoothing process and the backward smoothing process, to implement decoding in the OvXDM system, such that the obtained decoding sequence is more approximate to a real value. In addition, compared with that in a conventional decoding method, as a total number of times of overlapping increases, decoding complexity decreases, and decoding efficiency and system performance are improved.

A decoding process in another embodiment of the present application mainly includes a forward filtering process and backward filtering process.

A principle of the forward filtering process is the same as a principle of the Monte Carlo methods (Monte Carlo methods). The Monte Carlo methods are a class of very important numerical computation algorithms in statistics that rely on a probabilistic statistics theory. Their essential idea is: when a problem to be solved is an occurring probability of a random event or an expected value of a random variable, estimating the probability of the random event based on an "experiment" method and occurring frequency of the event, or obtaining some digital characteristics of the random variable, and using the probability or the digital characteristics as a solution of the problem. The Monte Carlo methods in statistics are correspondingly referred to as Particle Filter (PF) in engineering. An idea of the particle filter is representing a probability by using a particle set based on the Monte Carlo methods. The particle filter may be applied to a state space model in any form, and can relatively accurately reflect posterior probability distribution based on an observed quantity and a controlled quantity. A core idea of the particle filter is reflecting posterior probability distribution by using random state particles sampled from posterior probabilities, which is sequential importance sampling. Therefore, the particle filter is a process in which a group of random samples propagated in state space are found to approximately represent a probability density function, and a sample mean is used to replace an integral operation, so as to obtain a minimum variance estimation of system states. These samples are vividly referred to as "particles", and therefore the process is referred to as the particle filter. When a quantity of samples tends to be infinitely large, the distribution may approach probability density distribution in any form.

The backward filtering process is performed after the forward filtering process. Filter processing is performed on estimation particles again in a backward sequence based on a sequence estimated in forward filtering and a corresponding weight of the particle thereof, to obtain a more real estimation sequence.

Therefore, to sum up, in a double-filter smoothing (TFS) process, $p(y_{t:T}|x_t)$ represents backward filtering, which is calculated according to $p(y_{t+1:T}|x_{t+1})$ and the following formula:

$$p(y_{t:T}|x_t) = p(y_t|x_t) \int p(x_{t+1}|x_t) p(y_{t+1:T}|x_{t+1}) dx_{t+1};$$

wherein $p(y_{t:T}|x_t)$ is not probability density of $x_t$, because an integral of $p(y_{t:T}|x_t)$ on $x_t$ may be actually unlimited.

In a double-filter smoothing process, smooth distribution is calculated according to the forward filtering and auxiliary probability distribution $\tilde{p}(x_t|y_{t:T})$ on $x_t$. The auxiliary density is defined by using an artificial distribution sequence $\gamma_t(x_t)$: $\tilde{p}(x_t|y_{t:T}) \propto \gamma_t(x_t) p(y_{t:T}|x_t)$, and therefore may be represented as the following formula in combination with the aforementioned formula:

$$\tilde{p}(x_t|y_{t:T}) \propto \gamma_t(x_t) p(y_t|x_t) \int p(x_{t+1}|x_t) \frac{\tilde{p}(x_{t+1}|y_{t+1:T})}{\gamma_{t+1}(x_{t+1})} dx_{t+1}.$$

On the contrary, a process of recursively generating a weighted particle in the backward filtering may be represented as $$\tilde{p}(dx_t|y_{t:T}) \simeq \sum_{k=1}^{Ns} \tilde{\omega}_t^{(k)} \delta_{\tilde{x}_t^{(k)}}(dx_t).$$

Marginal smooth $p(x_t|y_{1:T})$ is calculated according to both the forward filtering (FF) and the backward filtering (BF):

$$p(x_t|y_{1:T}) \propto p(x_t|y_{1:t-1}) p(y_{t:T}|x_t) =$$

$$\left( \int p(x_t|x_{t-1}) p(x_{t-1}|y_{1:t-1}) dx_{t-1} \right) \times \left( \frac{\tilde{p}(x_t|y_{t:T})}{\gamma_t(x_t)} \right).$$

By using a Monte Carlo forward cloud $(x_{t-1}^{(j)}, \omega_{t-1}^{(j)})$, an integral in the aforementioned section is represented as the following formula:

$$p(x_t|y_{1:T}) \propto \left( \sum_{j=1}^{Ns} p(x_t|x_{t-1}^{(j)}) \omega_{t-1}^{(j)} \right) \times \left( \frac{\tilde{p}(x_t|y_{t:T})}{\gamma_t(x_t)} \right).$$

Finally, by using a backward filtering cloud $(\tilde{x}_t^{(k)}, \tilde{\omega}_t^{(k)})$, a particle cloud is represented as follows:

$$p(dx_t|y_{1:T}) \simeq \sum_{k=1}^{Ns} \tilde{\omega}_{t|T}^{(k)} \delta_{\tilde{x}_t^{(k)}}(dx_t); s$$

wherein weight of the particle is represented as $$\tilde{\omega}_{t|T}^{(k)} \propto \frac{\tilde{\omega}_t^{(k)}}{\gamma_t(\tilde{x}_t^k)} \sum_{j=1}^{Ns} p(\tilde{x}_t^{(k)}|x_{t-1}^{(j)}) \omega_{t-1}^{(j)}.$$

The aforementioned section describes a principle of the double-filtering process including the forward filtering and the backward filtering. The following section describes the forward filtering process and the backward filtering process in detail.

1. Forward filtering process:
(1) Constructing a particle set $x_t^{(i)} \sim q(x_t|y_t, x_{t-1}^{(i)}, \phi)$, wherein $x_{0:t}^{(i)} = [x_{0:t-1}^{(i)}, x_t^{(i)}]$.
(2) Calculating an importance weight $\omega_t^{(i)}$ of each particle in the particle set, wherein $\omega_t^{(i)}$ satisfies $$\sum_{i=1}^{Ns} \omega_t^{(i)} = 1.$$

(3) if the particle set satisfies a predetermined condition, performing a resampling operation on the particle set according to a formula $$x_{0:t}^{(i)} \sim \sum_{i=1}^{Ns} \omega_t^{(i)} \delta(x_{0:t}^{(i)}),$$

to obtain a new particle set.

In the aforementioned process, t≥1, and a value of i ranges from 1 to N. By repeatedly performing iterative operation as disclosed in the aforementioned section, forward filtering particle distribution more approximate to a real sequence is finally obtained.

2. Backward filtering process:
As described above, backward filtering is performed according to the forward filtering. Backward filtering is performed on estimation particles again in a backward sequence based on a sequence estimated in forward filtering and a corresponding weight of the particle thereof, to obtain a more real estimation sequence. In the backward filtering, weight of the particle is obtained by performing a calculating operation on an artificial distribution sequence $\gamma_t(x_t)$.

(4) BIF initialization

Initializing a particle set of the last symbol in a backward filtering sequence and a corresponding weight of the particle thereof.

(5) Constructing the artificial distribution sequence $\gamma_t(x_t)$:

$$\gamma_t(x_t) \triangleq \begin{cases} \gamma_1(x_1), & t = 1 \\ \int \gamma_{t-1}(x_{t-1}) f(x_t \mid x_{t-1}) dx_{t-1}, & t \geq 2 \end{cases}.$$

(6) Calculating weight of the particle in the backward filtering process.

Probability density $f(x_{t+1}|x_t)$ between a to-be-decoding sequence and an estimation particle is calculated, the probability density is used as auxiliary probability density in the backward filtering process based on a formula $$\gamma(x_t \mid x_{t+1}) = \frac{f(x_{t+1} \mid x_t)\gamma_t(x_t)}{\gamma_{t+1}(x_{t+1})},$$

and then a backward normalization weight $\tilde{\omega}_t$ for each particle is calculated based on the obtained auxiliary probability density in the backward filtering.

(7) Performing a resampling operation on a particle set if the particle set satisfies a predetermined condition. This step is not mandatory in the backward filtering process, and may be determined depending on an actual system requirement. An objective of this step is to ensure that estimation particles are more approximate to a real sequence, to improve estimating accuracy.

After the step (7), importance weights of particles of symbols in a estimation sequence in the forward filtering process and importance weights of particles of the symbols in the backward filtering process are obtained. Importance weight of the particle in the double-filtering process is calculated according to importance weight of the particle in the forward filtering process and importance weight of the particle in the backward filtering process. For example, for each symbol in the estimation sequence, importance weight of the particle of the symbol in the double-filtering process is calculated according to a formula $$\tilde{\omega}_{t|T}^{(k)} \propto \frac{\tilde{\omega}_t^{(k)}}{\gamma_t(\tilde{x}_t^k)} \sum_{j=1}^{Ns} p(\tilde{x}_t^{(k)} \mid x_{t-1}^{(j)}) \omega_{t-1}^{(j)},$$

wherein $\tilde{\omega}_{t|T}$ represents importance weight of the particle in the double-filtering process, $\omega_{t-1}^{(j)}$ represents importance weight of the particle of the same symbol in the forward filtering process, and $\tilde{\omega}_t^{(k)}$ represents importance weight of the particle of the same symbol in the backward filtering process. Finally, a particle that is approximate to a real symbol is selected from the estimation sequence according to a specific rule. For example, a particle that has a maximum importance weight in a particle set corresponding to each symbol in the double-filtering process is used as an estimated value of the symbol, and a final decoding sequence is outputted.

The aforementioned section describes the concept and the principle of the double-filter smoothing decoding method and device suitable for an OvXDM system, and the OvXDM system of the present application. The following section describes the present application in detail.

Figure 15:
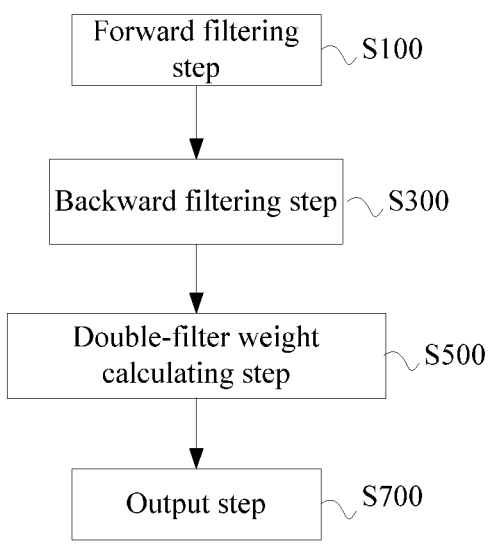
FIG. 15 is a schematic flowchart of a forward and backward decoding method suitable for an OvXDM system according to another embodiment of the present application.

In one embodiment, referring to FIG. 15, the double-filter smoothing decoding method suitable for an OvXDM system disclosed in the present application includes a forward filtering step S100, a backward filtering step S300, a double-filter weight calculating step S400, and an output step S500. The OvXDM system may be an OvTDM system, an OvFDM system, an OvCDM system, an OvSDM system, or an OvHDM system. FIG. 8 shows an equivalent convolutional coding model of the OvXDM system.

Forward filtering step S100: Starting from the first symbol to the last symbol in an estimation sequence, sequentially calculating importance weights of particles in a particle set corresponding to each symbol, to obtain importance weights of particles in a forward filtering process. Specifically, referring to FIG. 9, the forward filtering step S100 includes steps S101 to S109.

Step S101: Initializing the estimation sequence X. Because this is in the forward filtering process, the estimation sequence X is regarded as a forward filtering estimation sequence Xf, wherein a length of the estimation sequence X is the same as a length of a to-be-decoding sequence. For example, it is assumed that a receiving end of the OvXDM system receives a symbol sequence y whose length is N, the symbol sequence y is the to-be-decoding sequence. A total number of times of overlapping of the symbol sequence is K, and a rectangular wave is used as a multiplexing waveform. If a quantity of particles of each symbol is Ns, each particle is corresponding to a value of the importance weight. Therefore, a size of the forward filtering estimation sequence Xf is Ns×N, and a size of a set Wf of importance weight values corresponding to particles is Ns×N.

Step S103: Starting from the first symbol to the last symbol in the forward filtering estimation sequence Xf, generating a particle set that is corresponding to a current symbol. As described above, a quantity of particles in the particle set corresponding to each symbol is Ns. For example, in the OvXDM system, a binary data flow {+1, −1} is used as an example, there are only two possible values of each symbol: +1 or −1. Therefore, the particle set corresponding to each symbol includes two types of particles whose values are respectively +1 and −1. There are many methods for generating the particle set corresponding to the current symbol, the method is qualified if distribution of the generated particle set is approximate to theoretical distribution.

Step S105: After the particle set is generated for the current symbol, calculating importance probabilistic density between each particle of the current symbol and the to-be-decoding sequence, and calculating an importance weight of each particle. In one embodiment, the importance weight of each particle in the particle set corresponding to the current symbol is calculated according to the following formula:

$$W_f^{(i,j)} = \frac{P_{i,j}}{\sum_{j=1}^{Ns} P_{i,j}} \quad (i = 1 \sim N, j = 1 \sim N_s);$$

Wherein $W_b^{(i,j)}$ is importance weight of the particle, N is the length of the to-be-decoding sequence, Ns is a quantity of particles in the particle set corresponding to the current symbol, and $P_{i,j}$ is the importance probabilistic density of the particle. It can be learned that $W_b^{(i,j)}$ is actually a normalized importance weight of the particle.

In one embodiment, when i>1, that is, when the current symbol is the second symbol or a subsequent symbol, importance probabilistic density between a particle in the particle set of the current symbol and the to-be-decoding sequence may be calculated with reference to importance probabilistic density between a particle in the particle set of a previous symbol and the to-be-decoding sequence.

It should be noted that, in the OvXDM system, because the received symbol sequence y is performed by OvXDM coding, OvXDM coding needs also to be performed on particles of the estimation symbol, and then importance probabilistic density of the estimation symbol is calculated.

After importance weights of all particles in the particle set corresponding to the current symbol are calculated, step S107 is performed.

Step S107: Determining whether a particle set corresponding to the current symbol satisfies a predetermined particle degenerating condition; and if the particle set does not satisfy the predetermined particle degenerating condition, proceeding to a next symbol, that is, starting to perform step S103 on the next symbol; or if the particle set satisfies the predetermined particle degenerating condition, performing step S109. Step S107 is used to determine whether the particles in the particle set corresponding to the current symbol are subject to a significant degenerating phenomenon. For example, it may be set that a resampling operation needs to be performed on a particle set corresponding to a symbol when an effective particle capacity $$\hat{N}_{eff} = \frac{1}{\sum_{j=1}^{Ns}(Wf_{i,j})^2}$$

of the particle set corresponding to the symbol is smaller than a predetermined threshold. It should be noted that, the particle set failing to satisfy the predetermined particle degenerating condition means that the particle set corresponding to the current symbol is not subject to a serious degenerating phenomenon; and the particle set satisfying the predetermined particle degenerating condition means that the particle set corresponding to the current symbol is subject to a serious degenerating phenomenon, and therefore The resampling operation needs to be performed on the particle set.

Step S109: Performing a resampling operation on the particle set of the current symbol. The resampling operation is performed to delete particles having small weights and reserve particles having large weights, so as to eliminate the degenerating phenomenon. There are a plurality of resampling methods, including importance resampling, residual resampling, stratified resampling, and optimization and combination resampling. A basic idea of resampling is to replicate particles having large weights and eliminate particles having small weights. A new particle set is finally generated by resampling. A schematic diagram of resampling is shown in FIG. 10.

Figure 16:
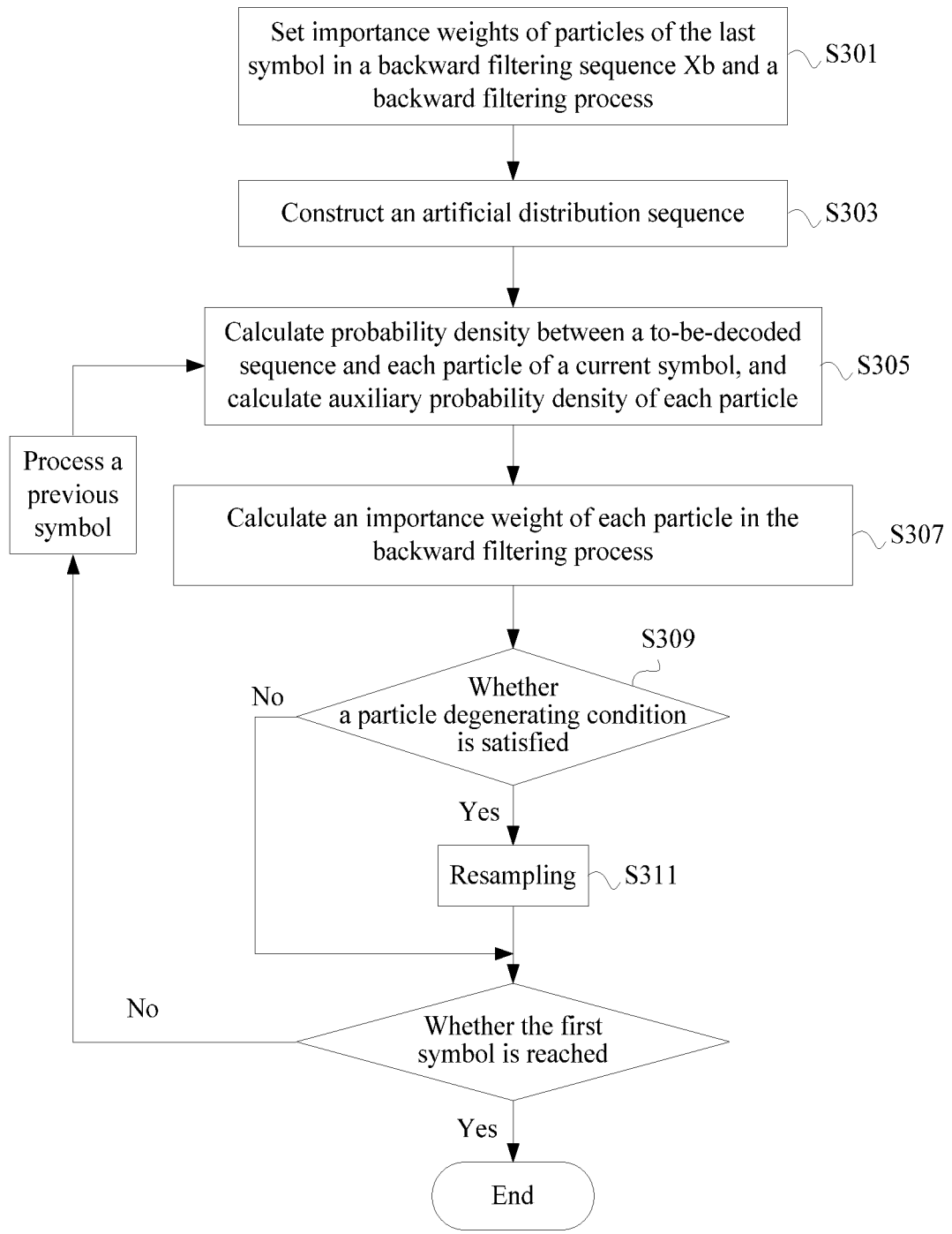
FIG. 16 is a schematic flowchart of a forward step according to another embodiment of the present application.

In addition, in specific implementation, the "starting from the first symbol to the last symbol in the forward filtering estimation sequence Xf" mentioned in step S103 may be: starting from the first symbol, performing step S101; if a determining result of step S107 is that the particle set corresponding to the current symbol does not satisfy the predetermined particle degenerating condition, or after the step S109, determining whether the last symbol is reached; and if the last symbol is reached, the forward filtering step S100 ends; otherwise, going to the next symbol, that is, performing step S103 on the next symbol, and continuing to perform subsequent steps according to a process shown in FIG. 16.

After the forward filtering step S100, namely, steps S101 to S109, symbols in the estimation sequence X (the forward filtering estimation sequence Xf) have corresponding particle sets, and each particle in the particle sets has an importance weight.

Backward filtering step S300: Starting from the last symbol to the first symbol in the estimation sequence X (the forward filtering estimation sequence Xf), sequentially calculating importance weights of particles in a particle set corresponding to each symbol, to obtain importance weights of particles in a backward filtering process. In one embodiment, referring to FIG. 16, the backward filtering step S300 includes steps S301 to S311.

Step S301: Based on a calculation result of the forward filtering step S100, regarding a particle that has a maximum importance weight in a particle set corresponding to the last symbol in the estimation sequence X (the forward filtering estimation sequence Xf), as an estimated value of the last symbol; and regarding importance weights of particles in the particle set corresponding to the last symbol in the estimation sequence X (the filtering smooth estimation sequence Xf) in the forward filtering process, as importance weights of the corresponding particles in the particle set corresponding to the last symbol in the estimation sequence X in the backward filtering process. In one embodiment, a backward filtering sequence Xb may alternatively be set, wherein a length of the sequence is N. The particle that has the maximum importance weight in the particle set corresponding to the last symbol in the estimation sequence X (the forward filtering estimation sequence Xf) is regarded as an estimated value of the last symbol in the backward filtering sequence Xb. This may be represented in the following form: Xb(N)=Xf (max, N). In addition, the importance weights of the particles in the particle set corresponding to the last symbol in the estimation sequence X (the forward filtering estimation sequence Xf) are assigned to importance weights Wb of the backward filtering sequence Xb. This may be represented as Wb(1~Ns, N)=Wf(1~Ns, N).

Step S303: Constructing an artificial distribution sequence, wherein a length of the artificial distribution sequence is the same as the length of the to-be-decoding sequence. In one embodiment, the constructed artificial distribution sequence is:

$$\gamma_t(x_t) \triangleq \begin{cases} \gamma_1(x_1), & t=1 \\ \int \gamma_{t-1}(x_{t-1})f(x_t \mid x_{t-1})dx_{t-1}, & t \geq 2 \end{cases},$$

wherein $\gamma_t(x_t)$ represents the artificial distribution sequence, and $x_t$ represents a symbol at a moment t.

Step S305: Starting from the last symbol to the first symbol in the estimation sequence X, calculating probability density between the to-be-decoding sequence and each particle of a current symbol; and calculating auxiliary probability density of each particle of the current symbol in the backward filtering process based on the artificial distribution sequence and the probability density between the to-bedecoding sequence and each particle of the current symbol. In one embodiment, the auxiliary probability density of each particle of the current symbol in the backward filtering process is calculated according to a formula $$\gamma(x_t \mid x_{t+1}) = \frac{f(x_{t+1} \mid x_t)\gamma_t(x_t)}{\gamma_{t+1}(x_{t+1})},$$

wherein $f(x_{t+1}|x_t)$ represents the probability density between the to-be-decoding sequence and each particle of the current symbol. It should be noted that the sequence estimated in the forward filtering process is not encoded; therefore, K times of OvXDM coding need to be performed on the estimation particle and a multiplexing waveform, and then probability density between the particle and the to-be-decoding sequence is calculated. In this case, multivariate normal probability density function (MVNPDF) is used.

Certainly, an implementation of the "starting from the last symbol to the first symbol in the estimation sequence X" mentioned in step S305 may alternatively be similar to the implementation of the "starting from the first symbol to the last symbol in the forward filtering estimation sequence Xf" mentioned in step S103. Details are not described herein again.

Step S307: Calculating an importance weight of each particle in the backward filtering process based on the auxiliary probability density of each particle of the current symbol in the backward filtering process. In one embodiment, the importance weight of each particle in the backward filtering process is calculated according to a formula $$W_b^{(i,j)} = \frac{\gamma_{i,j}}{\sum_{j=1}^{N_s} \gamma_{i,j}}, \ (i = 1 \sim N, j = 1 \sim N_s),$$

wherein $W_b^{(i,j)}$ is importance weight of the particle in the backward filtering process, N is the length of the to-be-decoding sequence, Ns is a quantity of particles in the particle set corresponding to the current symbol, and $\gamma_{i,j}$ is the auxiliary probability density of the particle. It can be learned that the calculated importance weight of each particle in the backward filtering process is actually a normalized importance weight.

Step S309: Determining, based on importance weights of the current symbol in the backward filtering process, whether a particle set corresponding to the current symbol satisfies a predetermined particle degenerating condition; and if the particle set does not satisfy the predetermined particle degenerating condition, proceeding to a previous symbol, that is, starting to perform step S305 on the previous symbol of the current symbol; or if the particle set satisfies the predetermined particle degenerating condition, performing step S311. An object of step S309 is the same as that of step S107. The particle degenerating conditions in the two steps may be the same, or may be different.

Step S311: Performing a resampling operation on the particle set of the current symbol. A method and a principle of step S311 are similar to those of step S109. Details are not described herein again. Step S309 and step S311 are not mandatory, and may be determined depending on an actual system requirement. An objective of both steps is to ensure that estimation particles are more approximate to a real sequence, to improve estimating accuracy.

Double-filter weight calculating step S400: Calculating importance weight of particle in a double-filtering process based on the importance weight of particle in the forward filtering process and the importance weight of particle in the backward filtering process. In one embodiment, in the double-filter weight calculating step, the importance weight of particle in the double-filtering process is calculated according to the following formula:

$$\tilde{\omega}_{t|T}^{(k)} \propto \frac{\tilde{\omega}_t^{(k)}}{\gamma_t(\tilde{x}_t^k)} \sum_{j=1}^{N_s} p(\tilde{x}_t^{(k)} \mid x_{t-1}^{(j)})\omega_{t-1}^{(j)};$$

wherein $\tilde{\omega}_{t|T}$ represents importance weight of the particle in the double-filtering process, $\omega_{t-1}^{(j)}$ represents importance weight of the particle in the forward filtering process, $\tilde{\omega}_t^{(k)}$ represents importance weight of the particle in the backward filtering process, $x_t^{(k)}$ represents a $k^{th}$ particle of the symbol at the moment t, and a symbol ~ represents a backward process.

Output step S500: Outputting a decoding sequence based on a calculation result of the double-filter weight calculating step S400. In one embodiment, in the output step S500, a particle that has a maximum importance weight in a particle set corresponding to each symbol in the double-filtering process is regarded as an estimated value of the symbol, and the final decoding sequence is outputted.

Figure 17:
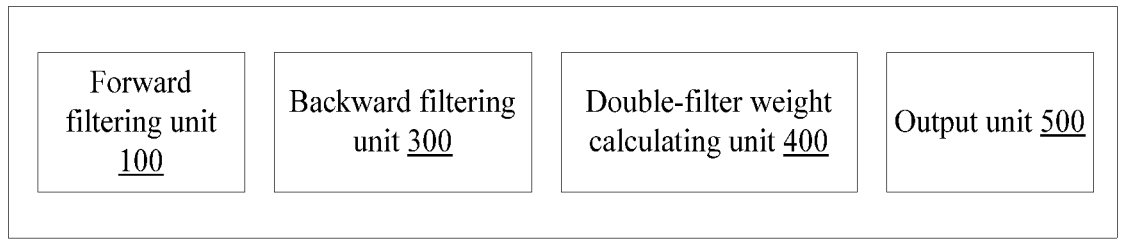
FIG. 17 is a schematic structural diagram of a decoding device according to another embodiment of the present application.

The aforementioned section describes the double-filter smoothing decoding method suitable for an OvXDM system disclosed in the present application. Correspondingly, the present application further discloses an OvXDM system. The OvXDM system may be an OvTDM system, an OvFDM system, an OvCDM system, an OvSDM system, or an OvHDM system. The OvXDM system includes a double-filter smoothing decoding device suitable for an OvXDM system. Referring to FIG. 17, the double-filter smoothing decoding device suitable for an OvXDM system includes a forward filtering unit 100, a backward filtering unit 300, a double-filter weight calculating unit 400, and an output unit 500.

Figure 18:
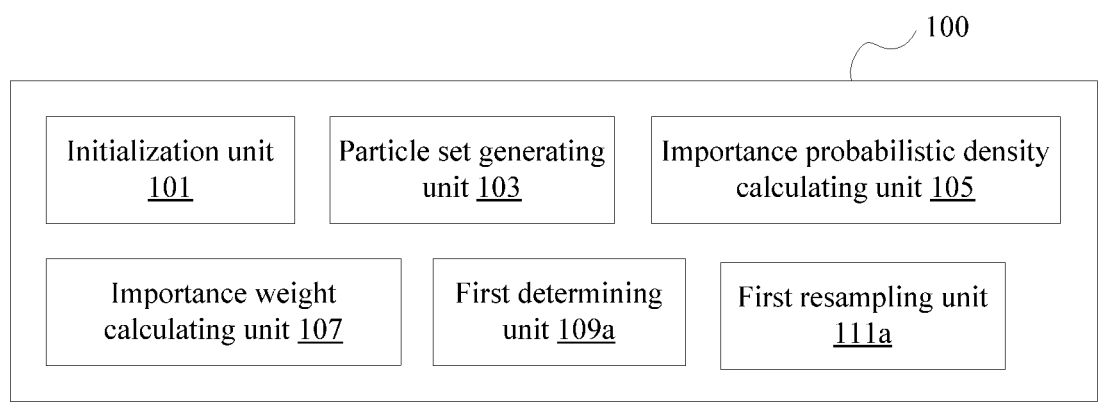
FIG. 18 is a schematic structural diagram of a forward unit according to another embodiment of the present application.

The forward filtering unit 100 is configured to: starting from the first symbol to the last symbol in an estimation sequence, sequentially calculate importance weights of particles in a particle set corresponding to each symbol, to obtain importance weights of particles in a forward smoothing process. In one embodiment, referring to FIG. 18, the forward filtering unit 100 includes an initialization unit 101, a particle set generating unit 103, an importance probabilistic density calculating unit 105, an importance weight calculating unit 107, a determining unit 109, and a resampling unit 111.

The initialization unit 101 is configured to initialize the estimation sequence X, wherein a length of the estimation sequence X is the same as a length of a to-be-decoding sequence. Because this is in the forward filtering process, the estimation sequence X is regarded as a forward filtering estimation sequence Xf, wherein a length of the estimation sequence is the same as a length of a to-be-decoding sequence. For example, it is assumed that a receiving end of the OvXDM system receives a symbol sequence y whose length is N, the symbol sequence y is the to-be-decoding sequence. A total number of times of overlapping of the symbol sequence is K, and a rectangular wave is used as a multiplexing waveform. If a quantity of particles of each symbol is Ns, each particle is corresponding to a value of the importance weight. Therefore, a size of the forward filtering estimation sequence Xf is Ns×N, and a size of a set Wf of importance weight values corresponding to particles is Ns×N.

The particle set generating unit 103 is configured to: starting from the first symbol to the last symbol in the estimation sequence X, generate a particle set corresponding to a current symbol. As described above, the quantity of particles in the particle set corresponding to each symbol is Ns. For example, in the OvXDM system, a binary data flow {+1, −1} is used as an example, there are only two possible values of each symbol: +1 or −1. Therefore, the particle set corresponding to each symbol includes two types of particles whose values are respectively +1 and −1. There are many methods for generating the particle set corresponding to the current symbol, the method is qualified if distribution of the generated particle set is approximate to theoretical distribution.

The importance probabilistic density calculating unit 105 is configured to: after the particle set is generated for the current symbol, calculate importance probabilistic density between each particle of the current symbol and the to-be-decoding sequence. In one embodiment, when i>1, that is, when the current symbol is the second or a subsequent symbol, the importance probabilistic density calculating unit 105 may calculate importance probabilistic density between a particle in the particle set of the current symbol and the to-be-decoding sequence with reference to importance probabilistic density between a particle in a particle set of a previous symbol and the to-be-decoding sequence. In the OvXDM system, because the received symbol sequence y is performed by OvXDM coding, OvXDM coding also needs to be performed on an estimation symbol particle $Xf_{i,j}$, and then importance probabilistic density of the symbol particle is calculated.

The importance weight calculating unit 107 is configured to calculate an importance weight of each particle based on the importance probabilistic density. In one embodiment, the importance weight calculating unit 107 calculates a normalized importance weight of each particle in the particle set corresponding to the current symbol based on the following formula:

$$W_f^{(i,j)} = \frac{P_{i,j}}{\sum_{j=1}^{Ns} P_{i,j}} \quad (i = 1 \sim N, \; j = 1 \sim N_s);$$

wherein $W_b^{(i,j)}$ is importance weight of the particle, N is the length of the to-be-decoding sequence, Ns is a quantity of particles in the particle set corresponding to the current symbol, and $P_{i,j}$ is the importance probabilistic density of the particle. It can be learned that $W_b^{(i,j)}$ is actually a normalized importance weight of the particle.

The determining unit 109 is configured to: determine whether a particle set corresponding to the current symbol satisfies a predetermined particle degenerating condition; and if the particle set does not satisfy the predetermined particle degenerating condition, notify the particle set generating unit 103 to generate a particle set corresponding to a next symbol. The determining unit 109a is configured to determine whether the particles in the particle set corresponding to the current symbol are subject to a significant degenerating phenomenon. For example, it may be set that resampling needs to be performed on a particle set corresponding to a symbol when an effective particle capacity $$\hat{N}_{eff} = \frac{1}{\sum_{j=1}^{Ns} (Wf_{i,j})^2}$$

of the particle set corresponding to the symbol is smaller than a predetermined threshold.

The resampling unit 111 is configured to: if the determining unit 109a determines that the particle set corresponding to the current symbol satisfies the predetermined particle degenerating condition, perform a resampling operation on the particle set of the current symbol. After performing resampling on the particle set of the current symbol, the resampling unit 111 notify the particle set generating unit 103 to generate a particle set corresponding to the next symbol.

The resampling unit 111 performs resampling to delete particles having small weights and reserve particles having large weights, so as to eliminate the degenerating phenomenon. There are a plurality of resampling methods, including importance resampling, residual resampling, stratified resampling, and optimization and combination resampling. A basic idea of resampling is to replicate particles having large weights and eliminate particles having small weights. A new particle set is finally generated by resampling. A schematic diagram of resampling is shown in FIG. 10.

Figure 19:
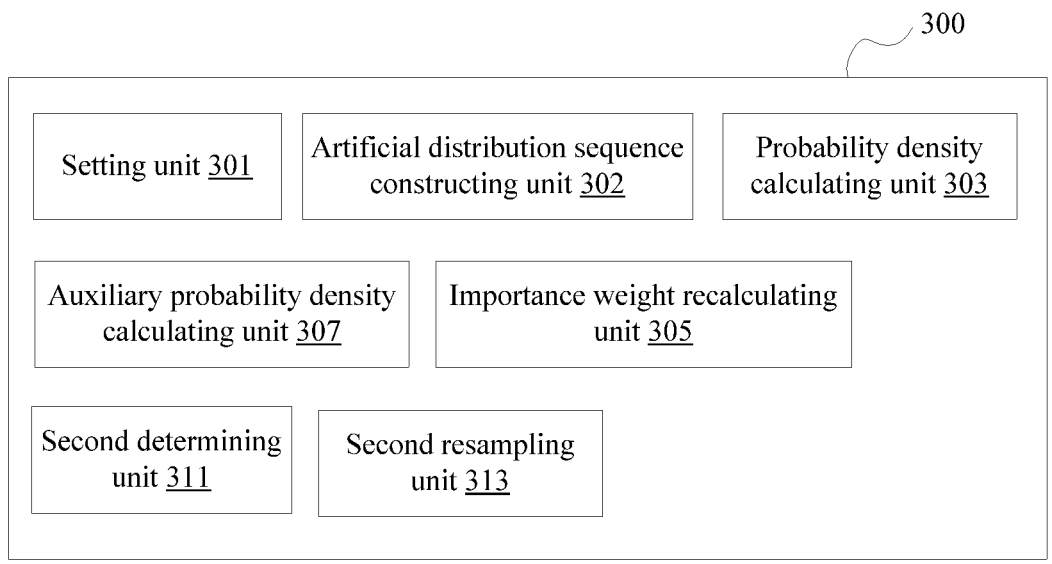
FIG. 19 is a schematic structural diagram of a backward unit according to another embodiment of the present application.

The backward filtering unit 300 is configured to: starting from the last symbol to the first symbol in the estimation sequence X (the forward filtering estimation sequence Xf), sequentially calculate importance weights of particles in a particle set corresponding to each symbol, to obtain importance weights of particles in a backward filtering process. In one embodiment, referring to FIG. 19, the backward filtering unit 300 includes a setting unit 301, an artificial distribution sequence constructing unit 302, a probability density calculating unit 303, an auxiliary probability density calculating unit 307, and an importance weight recalculating unit 305. In one embodiment, the backward filtering unit 300 may further include a second determining unit 311 and a second resampling unit 313.

The setting unit 301 is configured to: based on a calculation result of the forward filtering unit 100, regard a particle that has a maximum importance weight in a particle set corresponding to the last symbol in the estimation sequence X (the forward filtering estimation sequence Xf), as an estimated value of the last symbol; and regard importance weights of particles in the particle set corresponding to the last symbol in the estimation sequence X (the forward filtering estimation sequence Xf) in the forward filtering process, as importance weights of the corresponding particles in the particle set corresponding to the last symbol in the estimation sequence X in the backward filtering process. In one embodiment, a backward filtering sequence Xb may alternatively be set, wherein a length of the sequence is N. The setting unit 301 regards the particle that has the maximum importance weight in the particle set corresponding to the last symbol in the estimation sequence X (the forward filtering estimation sequence Xf), as an estimated value of the last symbol in the backward filtering sequence Xb. This may be represented in the following form: Xb(N)=Xf(max, N). In addition, the setting unit 301 assigns the importance weights of the particles in the particle set corresponding to the last symbol in the estimation sequence X (the forward filtering estimation sequence Xf), to importance weights Wb of the backward filtering sequence Xb. This may be represented as Wb(1~Ns, N)=Wf(1~Ns, N).

The artificial distribution sequence constructing unit 302 is configured to construct an artificial distribution sequence, wherein a length of the artificial distribution sequence is the same as the length of the to-be-decoding sequence. In one embodiment, the artificial distribution sequence constructing unit 302 constructs the artificial distribution sequence based on the following formula:

$$\gamma_t(x_t) \triangleq \begin{cases} \gamma_1(x_1), & t=1 \\ \int \gamma_{t-1}(x_{t-1})f(x_t \mid x_{t-1})dx_{t-1}, & t \geq 2 \end{cases};$$

wherein $\gamma_t(x_t)$ represents the artificial distribution sequence.

The probability density calculating unit 303 is configured to: starting from the last symbol to the first symbol in the estimation sequence, calculate probability density between the to-be-decoding sequence and each particle of the current symbol. It should be noted that the sequence estimated in the forward filtering process is not encoded; therefore, K times of OvXDM coding need to be performed on the estimation particle and a multiplexing waveform, and then probability density between the particle and the to-be-decoding sequence is calculated. In this case, multivariate normal probability density function (MVNPDF) is used.

The auxiliary probability density calculating unit 307 is configured to calculate auxiliary probability density of each particle of the current symbol in the backward filtering process based on the artificial distribution sequence and the probability density between the to-be-decoding sequence and each particle of the current symbol. In one embodiment, the auxiliary probability density calculating unit 307 performs calculation based on a formula $$\gamma(x_t \mid x_{t+1}) = \frac{f(x_{t+1} \mid x_t)\gamma_t(x_t)}{\gamma_{t+1}(x_{t+1})},$$

wherein $f(x_{t+1}|x_t)$ represents the probability density between the to-be-decoding sequence and each particle of the current symbol. The importance weight recalculating unit 305 is configured to calculate an importance weight of each particle in the backward filtering process based on the auxiliary probability density of each particle of the current symbol in the backward filtering process. In one embodiment, the importance weight of each particle in the backward filtering process is calculated according to a formula $$W_b^{(i,j)} = \frac{\gamma_{i,j}}{\sum_{j=1}^{N_s} \gamma_{i,j}}, (i = 1 \sim N, j = 1 \sim N_s),$$

wherein $W_b^{(i,j)}$ is importance weight of the particle in the backward filtering process, N is the length of the to-be-decoding sequence, Ns is a quantity of particles in the particle set corresponding to the current symbol, and $\gamma_{i,j}$ is the auxiliary probability density of the particle. It can be learned that the calculated importance weight of each particle in the backward filtering process is actually a normalized importance weight.

The second determining unit 311 is configured to: determine, based on importance weights of the current symbol in the backward filtering process, whether a particle set corresponding to the current symbol satisfies a predetermined particle degenerating condition; and if the particle set satisfies the predetermined particle degenerating condition, notify the second resampling unit 313 to perform a resampling operation on the particle set of the current symbol; or if the particle set does not satisfy the predetermined particle degenerating condition, notify the probability density calculating unit 303 to perform a calculating operation on a previous symbol. The second determining unit 311 is similar to the first determining unit 109a. The predetermined particle degenerating conditions of them may be the same, or may be different. Details are not described herein.

The second resampling unit 313 is configured to: if the second determining unit 311 determines that the particle set corresponding to the current symbol satisfies the predetermined particle degenerating condition, perform a resampling operation on the particle set of the current symbol. The second resampling unit 313 performs a resampling operation on the particle set of the current symbol, and notifies the probability density calculating unit 303 to perform a calculating operation on the previous symbol. The second resampling unit 313 is similar to the first resampling unit 111a. Details are not described herein again.

The double-filter weight calculating unit 400 is configured to calculate importance weight of the particle in a double-filtering process based on importance weight of the particle in the forward filtering process and importance weight of the particle in the backward filtering process. In one embodiment, the double-filter weight calculating unit 400 calculates importance weight of the particle in the double-filtering process based on the following formula:

$$\tilde{\omega}_{t|T}^{(k)} \propto \frac{\tilde{\omega}_t^{(k)}}{\gamma_t(\tilde{x}_t^k)} \sum_{j=1}^{Ns} p(\tilde{x}_t^{(k)} \mid x_{t-1}^{(j)})\omega_{t-1}^{(j)};$$

wherein $\tilde{\omega}_{t|T}$ represents importance weight of the particle in the double-filtering process, $\omega_{t-1}^{(j)}$ represents importance weight of the particle in the forward filtering process, and $\tilde{\omega}_t^{(k)}$ represents importance weight of the particle in the backward filtering process.

The output unit 500 is configured to output a decoding sequence based on a calculation result of the double-filter weight calculating unit 400. In one embodiment, the output unit 500 regards a particle that has a maximum importance weight in a particle set corresponding to each symbol in the double-filtering process, as an estimated value of the symbol; and outputs the final decoding sequence.

The aforementioned section describes the OvXDM system and the double-filter smoothing decoding device suitable for an OvXDM system that are disclosed in the present application.

In the present application, when a particle set is generated for each particle in a decoding process, for an unknown sequence, particle distribution of the sequence is unknown at an initial stage; therefore, a group of samples may be randomly generated first; importance weights of a particle and an observed value are calculated, to determine particle reliability; resampling is performed on particle samples according to a specific criterion, to eliminate particles with small weights and replicate particles with large weights; and a relatively reliable output value is finally obtained through repeated iteration calculation. A more accurate result is obtained when a total number of times of iteration is greater. In addition, a particle degenerating phenomenon is a largest defect of a particle filter, and restricts development of the particle filter. An effective method for solving the particle degenerating problem is performing resampling on particles. The particle filter has unique advantages in terms of parameter estimation and state filtering for solving nonlinear and non-Gaussian problems, and therefore has large development space. A plurality of mature optimization methods may be introduced into a resampling process, so as to more quickly obtain typical "particles" that reflect system probabilistic characteristics.

In the present application, importance weights of particles in a particle set corresponding to a symbol are calculated by using forward filtering and backward filtering, and screening is performed with reference to importance weights of particles of the forward filtering and importance weights of particles of the backward filtering, to output a final decoding sequence. In this process, mutual information between particles is fully utilized to implement decoding of the OvXDM system, such that the obtained decoding sequence is more approximate to a real value. In addition, compared with a conventional decoding method, as a total number of times of overlapping increases, decoding complexity decreases, and decoding efficiency and system performance are improved.

The aforementioned section is a further detailed description of the present application with reference to specific embodiments, and it should not be considered that specific implementation of the present application is limited only to the description. A person of ordinary skill in the technical field to which the present application belongs may further make simple derivations or replacements without departing from the inventive concept of the present application.

What is claimed is:

1. A forward and backward decoding method being executed by a computer, the forward and backward decoding method comprising the following steps:
   a forward step: starting from a first symbol to a last symbol in an estimation sequence, sequentially calculating importance weights of particles in a particle set corresponding to each symbol, to obtain importance weights of particles in a forward process;
   a backward step: starting from the last symbol to the first symbol in the estimation sequence, sequentially calculating importance weights of particles in a particle set corresponding to each symbol with reference to the importance weights of particles obtained in the forward step, to obtain importance weights of particles in a backward process; and
   an output step: obtaining an estimated value corresponding to each symbol, and outputting a final decoding sequence.

2. The forward and backward decoding method according to claim 1, wherein the output step comprising:
   regarding the particle that has a maximum importance weight in the particle set corresponding to each symbol in the backward process, as the estimated value of the symbol; and outputting the final decoding sequence.

3. The forward and backward decoding method according to claim 2, wherein the backward step comprises:
   based on a calculation result of the forward step, regarding a particle that has a maximum importance weight in a particle set corresponding to the last symbol in the estimation sequence, as an estimated value of the last symbol; and regarding importance weights of particles in the particle set corresponding to the last symbol in the estimation sequence in the forward process, as importance weights of the corresponding particles in the particle set corresponding to the last symbol in the estimation sequence in the backward process; and
   starting from the last second symbol to the first symbol in the estimation sequence, calculating probability density between a current symbol and a next symbol; and calculating importance weights of particles of the current symbol in the backward process based on the probability density, importance weights of particles of the next symbol in the backward process, and importance weights of particles of the current symbol in the forward process.

4. The forward and backward decoding method according to claim 3, wherein in the backward step, the importance weights of the particles in the particle set corresponding to each symbol are calculated according to the following formula:

$$\omega_{t|T}^{(i)} = \omega_t^{(i)} \sum_{j=1}^{Ns} \left[ \omega_{t+1|T}^{(j)} \frac{p(x_{t+1}^{(j)} | x_t^{(i)})}{\sum_{k=1}^{Ns} p(x_{t+1}^{(j)} | x_t^{(k)}) \omega_t^{(k)}} \right];$$

wherein Ns is a quantity of particles in a particle set corresponding to the current symbol, i and j represent particle indexes and range from 1 to Ns, and $x_t$ represents a symbol at a moment t; and
wherein $\omega_t$ represents importance weights of particles of the current symbol in the forward process, $p(x_{t+1}^{(j)}|x_t^{(k)})$ is the probability density between the current symbol and the next symbol, and $\omega_{t|T}$ represents importance weights of particles of the current symbol in the backward process.

5. The forward and backward decoding method according to claim 1, wherein the backward step further comprises:
   a double-filter weight calculating step: calculating importance weight of the particle in a double-filtering process based on importance weight of the particle in the forward process and importance weight of the particle in the backward process;
   wherein the output step comprises: regarding a particle that has a maximum importance weight in a particle set corresponding to each symbol in the double-filtering process, as an estimated value of the symbol; and outputting the final decoding sequence.

6. The forward and backward decoding method according to claim 5, wherein the backward step comprises: based on a calculation result of the forward step, regarding a particle that has a maximum importance weight in a particle set corresponding to the last symbol in the estimation sequence, as an estimated value of the last symbol; and regarding importance weights of particles in the particle set corresponding to the last symbol in the estimation sequence in a forward filtering process, as importance weights of the corresponding particles in the particle set corresponding to the last symbol in the estimation sequence in a backward filtering process;
   constructing an artificial distribution sequence, wherein a length of the artificial distribution sequence is the same as a length of a to-be-decoding sequence;
   starting from the last symbol to the first symbol in the estimation sequence, calculating probability density between the to-be-decoding sequence and each particle of a current symbol; and calculating auxiliary probability density of each particle of the current symbol in the backward filtering process based on the artificial distribution sequence and the probability density between the to-be-decoding sequence and each particle of the current symbol; and respectively calculating importance weights of the particles in the backward filtering process based on the auxiliary probability densities of the particles of the current symbol in the backward filtering process.

7. The forward and backward decoding method according to claim 6, wherein in the backward step, it is further determined, based on the importance weights of the current symbol in the backward filtering process, whether a particle set corresponding to the current symbol satisfies a predetermined particle degenerating condition; and if the particle set satisfies the predetermined particle degenerating condition, a resampling operation is performed on the particle set of the current symbol; or if the particle set does not satisfy the predetermined particle degenerating condition, the process goes to a previous symbol.

8. The forward and backward decoding method according to claim 7, wherein:

the constructed artificial distribution sequence is $$\gamma_t(x_t) \Box \begin{cases} \gamma_1(x_1), & t=1 \\ \int \gamma_{t-1}(x_{t-1})f(x_t \mid x_{t-1})dx_{t-1}, & t \geq 2 \end{cases},$$

wherein $\gamma_t(x_t)$ represents the artificial distribution sequence; the auxiliary probability density of each particle of the current symbol in the backward filtering process is calculated according to a formula $$\gamma(x_t \mid x_{t+1}) = \frac{f(x_{t+1} \mid x_t)\gamma_t(x_t)}{\gamma_{t+1}(x_{t+1})},$$

wherein $f(x_{t+1}|x_t)$ represents the probability density between the to-be-decoding sequence and each particle of the current symbol, and $x_t$ represents a symbol at a moment t; and the importance weight of each particle in the backward filtering process is calculated according to the following formula:

$$W_b^{(i,j)} = \frac{\gamma_{i,j}}{\sum_{j=1}^{N_s} \gamma_{i,j}}, (i=1 \sim N, j=1 \sim N_s)$$

wherein $W_b^{(i,j)}$ is importance weight of the particle in the backward filtering process, N is the length of the to-be-decoding sequence, Ns is a quantity of particles in the particle set corresponding to the current symbol, and $\gamma_{i,j}$ is the auxiliary probability density of the particle.

9. The forward and backward decoding method according to claim 3, wherein in the double-filter weight calculating step, importance weight of the particle in the double-filtering process is calculated according to the following formula:

$$\tilde{\omega}_{t|T}^{(k)} \propto \frac{\tilde{\omega}_t^{(k)}}{\gamma_t(\tilde{x}_t^k)} \sum_{j=1}^{N_s} p(\tilde{x}_t^{(k)} \mid x_{t-1}^{(j)})\omega_{t-1}^{(j)}$$

wherein $\tilde{\omega}_{t|T}$ represents importance weight of the particle in the double-filtering process, $\omega_{t-1}^{(j)}$ represents importance weight of the particle in the forward filtering process, $\omega_t^{(k)}$ represents importance weight of the particle in the backward filtering process, $x_t^{(k)}$ represents a k$^{th}$ particle of the symbol at the moment t, and a symbol ~ represents a backward process.

10. The forward and backward decoding method according to claim 1, wherein the forward step further comprises:

initializing the estimation sequence, wherein a length of the estimation sequence is the same as a length of a to-be-decoding sequence; and starting from the first symbol to the last symbol in the estimation sequence, generating a particle set that is corresponding to a current symbol; calculating importance probabilistic density between each particle of the current symbol and the to-be-decoding sequence, and calculating an importance weight of each particle; determining whether a particle set corresponding to the current symbol satisfies a predetermined particle degenerating condition; and if the particle set satisfies the predetermined particle degenerating condition, performing a resampling operation on the particle set of the current symbol; or if the particle set does not satisfy the predetermined particle degenerating condition, proceeding to a next symbol.

11. The forward and backward decoding method according to claim 10, wherein in the forward step, the importance weight of each particle in the particle set corresponding to the current symbol is calculated according to the following formula:

$$wf_{i,j} = \frac{P_{i,j}}{\sum_{j=1}^{N_s} P_{i,j}} \ (i=1 \sim N, j=1 \sim Ns);$$

wherein $wf_{i,j}$ is importance weight of the particle, N is the length of the to-be-decoding sequence, Ns is a quantity of particles in the particle set corresponding to the current symbol, and $P_{i,j}$ is the importance probabilistic density of the particle.

12. A forward and backward decoding device being implemented by a computer, the forward and backward decoding device comprising:

a forward unit, configured to: starting from a first symbol to a last symbol in an estimation sequence, sequentially calculate importance weights of particles in a particle set corresponding to each symbol, to obtain importance weights of particles in a forward smoothing process;

a backward unit, configured to: starting from the last symbol to the first symbol in the estimation sequence, sequentially calculate importance weights of particles in a particle set corresponding to each symbol with reference to the importance weights of particles obtained by the forward unit, to obtain importance weights of particles in a backward smoothing process; and an output unit, configured to output a final decoding sequence.

13. The forward and backward decoding device according to claim 12, wherein the output unit regards a particle that has a maximum importance weight in the particle set corresponding to each symbol in the backward smoothing process, as an estimated value of the symbol; and outputs the final decoding sequence.

14. The forward and backward decoding device according to claim 12, further comprising:

a double-filter weight calculating unit, configured to calculate importance weight of the particle in a double-filtering process based on importance weight of the particle in a forward filtering process and importance weight of the particle in a backward filtering process;

wherein the output unit regards a particle that has a maximum importance weight in a particle set corresponding to each symbol in the double-filtering process, as an estimated value of the symbol; and outputs the final decoding sequence.

15. The forward and backward decoding device according to claim 12, wherein the forward unit comprises:
an initialization unit, configured to initialize the estimation sequence, wherein a length of the estimation sequence is the same as a length of a to-be-decoding sequence;
a particle set generating unit, configured to: starting from the first symbol to the last symbol in the estimation sequence, generate a particle set corresponding to a current symbol;
an importance probabilistic density calculating unit, configured to: after the particle set is generated for the current symbol, calculate importance probabilistic density between each particle of the current symbol and the to-be-decoding sequence;
an importance weight calculating unit, configured to calculate an importance weight of each particle based on the importance probabilistic density;
a determining unit, configured to: determine whether a particle set corresponding to the current symbol satisfies a predetermined particle degenerating condition; and if the particle set does not satisfy the predetermined particle degenerating condition, notify the particle set generating unit to generate a particle set corresponding to a next symbol; and
a resampling unit, configured to: if the determining unit determines that the particle set satisfies the predetermined particle degenerating condition, perform a resampling operation on the particle set of the current symbol.

16. The forward and backward decoding device according to claim 12, wherein the backward unit comprises:
a setting unit, configured to: based on a calculation result of the forward unit, regard a particle that has a maximum importance weight in a particle set corresponding to the last symbol in the estimation sequence, as an estimated value of the last symbol; and regard importance weights of particles in the particle set corresponding to the last symbol in the estimation sequence in the forward process, as importance weights of the corresponding particles in the particle set corresponding to the last symbol in the estimation sequence in the backward process;
a probability density calculating unit, configured to: starting from the last second symbol to the first symbol in the estimation sequence, calculate probability density between a current symbol and a next symbol; and
an importance weight recalculating unit, configured to: after the probability density between the current symbol and the next symbol is calculated, calculate importance weights of particles of the current symbol in the backward process based on the probability density, importance weights of particles of the next symbol in the backward process, and importance weights of particles of the current symbol in the forward process.

17. The forward and backward decoding device according to claim 12, wherein the forward unit comprises:
an initialization unit, configured to initialize the estimation sequence, wherein a length of the estimation sequence is the same as a length of a to-be-decoding sequence;
a particle set generating unit, configured to: starting from the first symbol to the last symbol in the estimation sequence, generate a particle set corresponding to a current symbol;
an importance probabilistic density calculating unit, configured to: after the particle set is generated for the current symbol, calculate importance probabilistic density between each particle of the current symbol and the to-be-decoding sequence;
an importance weight calculating unit, configured to calculate an importance weight of each particle based on the importance probabilistic density;
a first determining unit, configured to: determine whether a particle set corresponding to the current symbol satisfies a predetermined particle degenerating condition; and if the particle set does not satisfy the predetermined particle degenerating condition, notify the particle set generating unit to generate a particle set corresponding to a next symbol; and
a first resampling unit, configured to: if the first determining unit determines that the particle set satisfies the predetermined particle degenerating condition, perform a resampling operation on the particle set of the current symbol.

18. The forward and backward decoding device according to claim 17, wherein the backward unit comprises:
a setting unit, configured to: based on a calculation result of a forward filtering unit, regard a particle that has a maximum importance weight in a particle set corresponding to the last symbol in the estimation sequence, as an estimated value of the last symbol; and regard importance weights of particles in the particle set corresponding to the last symbol in the estimation sequence in a forward filtering process, as importance weights of the corresponding particles in the particle set corresponding to the last symbol in the estimation sequence in a backward filtering process;
an artificial distribution sequence constructing unit, configured to construct an artificial distribution sequence, wherein a length of the artificial distribution sequence is the same as the length of the to-be-decoding sequence;
a probability density calculating unit, configured to: starting from the last symbol to the first symbol in the estimation sequence, calculate probability density between the to-be-decoding sequence and each particle of the current symbol;
an auxiliary probability density calculating unit, configured to calculate auxiliary probability density of each particle of the current symbol in the backward filtering process based on the artificial distribution sequence and the probability density between the to-be-decoding sequence and each particle of the current symbol; and
an importance weight recalculating unit, configured to respectively calculate importance weights of the particles in the backward filtering process based on the auxiliary probability densities of the particles of the current symbol in the backward filtering process.

19. The forward and backward decoding device according to claim 18, wherein the artificial distribution sequence constructing unit constructs the artificial distribution sequence based on the following formula:

$$\gamma_t(x_t) \square \begin{cases} \gamma_1(x_1), & t = 1 \\ \int \gamma_{t-1}(x_{t-1}) f(x_t | x_{t-1}) dx_{t-1}, & t \geq 2 \end{cases};$$

wherein $\gamma_t(x_t)$ represents the artificial distribution sequence, and $x_t$ represents a symbol at a moment t;

the auxiliary probability density calculating unit performs a calculating operation based on a formula $$\gamma(x_t \mid x_{t+1}) = \frac{f(x_{t+1} \mid x_t)\gamma_t(x_t)}{\gamma_{t+1}(x_{t+1})},$$

wherein $f(x_{t+1}|x_t)$ represents the probability density between the to-be-decoding sequence and each particle of the current symbol; and the importance weight recalculating unit performs a calculating operation based on the following formula:

$$W_b^{(i,j)} = \frac{\gamma_{i,j}}{\sum_{j=1}^{N_s} \gamma_{i,j}}, (i = 1 \sim N, j = 1 \sim N_s)$$

wherein $W_b^{(i,j)}$ is importance weight of the particle in the backward filtering process, N is the length of the to-be-decoding sequence, Ns is a quantity of particles in the particle set corresponding to the current symbol, and $\gamma_{i,j}$ is the auxiliary probability density of the particle.

20. The forward and backward decoding device according to claim 17, further comprising a second determining unit and a second resampling unit, wherein the second determining unit is configured to: determine, based on importance weights of the current symbol in the backward filtering process, whether a particle set corresponding to the current symbol satisfies a predetermined particle degenerating condition; and if the particle set satisfies the predetermined particle degenerating condition, notify the second resampling unit to perform a resampling operation on the particle set of the current symbol; or if the particle set does not satisfy the predetermined particle degenerating condition, notify the probability density calculating unit to perform a calculating operation on a previous symbol.

* * * * *